United States Patent
Jin et al.

(10) Patent No.: US 11,669,448 B2
(45) Date of Patent: Jun. 6, 2023

(54) TRANSMITTERS FOR GENERATING MULTI-LEVEL SIGNALS AND MEMORY SYSTEM INCLUDING THE SAME

(71) Applicant: Samsung Electronics Co., Ltd., Suwon-si (KR)

(72) Inventors: Hyungmin Jin, Seoul (KR); Jindo Byun, Suwon-si (KR); Younghoon Son, Yongin-si (KR); Youngdon Choi, Seoul (KR); Junghwan Choi, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 17/320,460

(22) Filed: May 14, 2021

(65) Prior Publication Data
US 2022/0075725 A1 Mar. 10, 2022

(30) Foreign Application Priority Data

Sep. 11, 2020 (KR) .......... 10-2020-0117104

(51) Int. Cl.
| | |
|---|---|
| *G06F 12/0802* | (2016.01) |
| *G11C 7/10* | (2006.01) |
| *G11C 8/06* | (2006.01) |
| *H03K 19/00* | (2006.01) |
| *H03K 19/0185* | (2006.01) |

(52) U.S. Cl.
CPC ........ *G06F 12/0802* (2013.01); *G11C 7/1048* (2013.01); *G11C 8/06* (2013.01); *H03K 19/0027* (2013.01); *H03K 19/018521* (2013.01)

(58) Field of Classification Search
CPC . G06F 12/0802; G06F 3/0658; G11C 7/1048; G11C 8/06; G11C 16/26; G11C 16/08; G11C 11/5642; G11C 7/1069; G11C 2207/101; G11C 7/1006; G11C 16/14; G11C 5/147; G11C 7/1051; G11C 7/222; H03K 19/0027; H03K 19/018521; H04L 25/4917; H04L 25/028
USPC .................................................... 365/185.23
See application file for complete search history.

(56) References Cited

U.S. PATENT DOCUMENTS

| | | | |
|---|---|---|---|
| 6,278,300 | B1 | 8/2001 | Urakawa |
| 7,626,442 | B2 | 12/2009 | Zerbe et al. |
| 7,868,667 | B2 | 1/2011 | Park et al. |
| 7,948,262 | B2 | 5/2011 | Nguyen |

(Continued)

FOREIGN PATENT DOCUMENTS

WO 0150228 A2 7/2001

*Primary Examiner* — Fernando Hidalgo
(74) *Attorney, Agent, or Firm* — Myers Bigel, P.A.

(57) ABSTRACT

A multi-level signal transmitter includes a voltage selection circuit, which is configured to select one amongst a plurality of driving voltages, which have different voltage levels, in response to input data including at least two bits of data therein. A driver circuit is also provided, which is configured to generate an output data signal as a multi-level signal, in response to the selected one of the plurality of driving voltages. This selected signal is provided as a body bias voltage to at least one transistor within the driver circuit. This driver circuit may include a totem-pole arrangement of first and second MOS transistors having respective first and second body bias regions therein, and at least one of the first and second body bias regions may be responsive to the selected one of the plurality of driving voltages.

8 Claims, 25 Drawing Sheets

(56) References Cited

U.S. PATENT DOCUMENTS

| | | |
|---|---|---|
| 8,063,658 B2 | 11/2011 | Gillingham |
| 9,972,395 B2 * | 5/2018 | Tran ........................ H01L 28/00 |
| 2005/0134361 A1 * | 6/2005 | Tschanz .................... G06F 1/10 |
| | | 327/534 |
| 2015/0333753 A1 | 11/2015 | Chen et al. |
| 2019/0043543 A1 | 2/2019 | Butterfield |
| 2019/0394071 A1 | 12/2019 | Farzan et al. |
| 2020/0066309 A1 | 2/2020 | Mayer et al. |

* cited by examiner

FIG. 9A

| DAT | | SVBn |
|---|---|---|
| D1 | D0 | |
| 0 | 0 | VBn1 |
| 0 | 1 | VBn2 |
| 1 | 0 | VBn3 |
| 1 | 1 | VBn4 |

FIG. 9B

| VBn | VTHn | DS |
|---|---|---|
| VBn1 | VTHn1 | VCCQ-VTHn1 |
| VBn2 | VTHn2 | VCCQ-VTHn2 |
| VBn3 | VTHn3 | VCCQ-VTHn3 |
| VBn4 | VTHn4 | VCCQ-VTHn4 |

FIG. 11A

| DAT | | SVBp |
|---|---|---|
| D1 | D0 | |
| 0 | 0 | VBp1 |
| 0 | 1 | VBp2 |
| 1 | 0 | VBp3 |
| 1 | 1 | VBp4 |

FIG. 11B

| VBp | VTHp | DS |
|---|---|---|
| VBp1 | VTHp1 | VTHp1 |
| VBp2 | VTHp2 | VTHp2 |
| VBp3 | VTHp3 | VTHp3 |
| VBp4 | VTHp4 | VTHp4 |

| EN | TMRS_IN | STATUS |
|---|---|---|
| 0 | 0 | OFF |
| 1 | 0 | OFF |
| 1 | VCCQ | MP31,MP32 ON |
| 0 | VCCQ | MN31,MN32 ON |

FIG. 16A

| DAT | | SVCCQ |
|---|---|---|
| D1 | D0 | |
| 0 | 0 | VCCQ1 |
| 0 | 1 | VCCQ2 |
| 1 | 0 | VCCQ3 |
| 1 | 1 | VCCQ4 |

FIG. 16B

| VCCQ | DS |
|---|---|
| VCCQ1 | VCCQ1−VTHn |
| VCCQ2 | VCCQ2−VTHn |
| VCCQ3 | VCCQ3−VTHn |
| VCCQ4 | VCCQ4−VTHn |

FIG. 20

| DAT | | DS |
|---|---|---|
| D1 | D0 | |
| 0 | 0 | V0n1=VCCQ-VTHn1 |
| 0 | 1 | V0n2=VCCQ-VTHn2 |
| 1 | 0 | V0n3=VCCQ-VTHn3 |
| 1 | 1 | V0n4=VCCQ-VTHn4 |

FIG. 22

| DAT ||  DS  |
|----|----|----|
| D1 | D0 |    |
| 0  | 0  | V0p1=VTHp1 |
| 0  | 1  | V0p2=VTHp2 |
| 1  | 0  | V0p3=VTHp3 |
| 1  | 1  | V0p4=VTHp4 |

FIG. 24

| DAT | | DS |
|---|---|---|
| D1 | D0 | |
| 0 | 0 | VSS |
| 0 | 1 | VTHp |
| 1 | 0 | VCCQ-VTHn |
| 1 | 1 | VCCQ |

TRANSMITTERS FOR GENERATING MULTI-LEVEL SIGNALS AND MEMORY SYSTEM INCLUDING THE SAME

REFERENCE TO PRIORITY APPLICATION

This application claims priority under 35 USC § 119 to Korean Patent Application No. 10-2020-0117104, filed Sep. 11, 2020, the disclosure of which is hereby incorporated herein by reference.

BACKGROUND

1. Technical Field

Example embodiments relate generally to semiconductor integrated circuits and, more particularly, to transmitters for generating multi-level signals and memory systems including the transmitters.

2. Description of the Related Art

Semiconductor memory devices can generally be divided into two categories depending upon whether or not they retain stored data when disconnected from a power supply. These categories include volatile memory devices, which lose stored data when disconnected from power, and nonvolatile memory devices, which retain stored data when disconnected from power. Volatile memory devices may perform read and write operations at relatively high speeds, while contents stored therein may be lost at power-off. Nonvolatile memory devices may retain contents stored therein even at power-off, which means they may be used to store data that must be retained regardless of whether they are powered.

Recently, as the performance of the semiconductor memory device is improved, a high communication speed (or interface speed) is required between a memory controller and the semiconductor memory device. Thus, multi-level signaling, in which a plurality of bits are transmitted during one unit interval (UI), has been researched as a means of increasing data bandwidth.

SUMMARY

At least one example embodiment of the present disclosure provides a transmitter that implements multi-level signaling.

At least one example embodiment of the present disclosure provides a memory system that includes the transmitter.

According to example embodiments, a transmitter is provided, which is configured to generate a multi-level signal having one of three or more voltage levels that are different from each other. This transmitter includes a voltage selection circuit, a driver circuit and an output pad. The voltage selection circuit selects one of a plurality of driving voltages having different voltage levels based on input data including two or more bits. The driver circuit generates an output data signal that is the multi-level signal based on the selected driving voltage output from the voltage selection circuit. The output pad is connected to the driver circuit and outputs the output data signal. Each of the plurality of driving voltages is a body bias voltage or a power supply voltage applied to a transistor included in the driver circuit.

According to example embodiments, a transmitter, which is configured to generate a multi-level signal having one of three or more voltage levels that are different from each other, includes a driver circuit, an output selection circuit and an output pad. The driver circuit generates a plurality of voltage signals having the three or more voltage levels based on a power supply voltage, a ground voltage and at least one body bias voltage. The output selection circuit selects one of the plurality of voltage signals based on input data including two or more bits, and outputs the selected voltage signal as an output data signal that is the multi-level signal. The output pad is connected to the output selection circuit and outputs the output data signal. The driver circuit includes a plurality of drivers including transistors of different types. Each of the transistors is connected between the power supply voltage and the ground voltage. Transistors within different drivers may have different threshold voltages.

According to example embodiments, a transmitter configured to generate a multi-level signal, which has one of three or more voltage levels that are different from each other, includes a driver circuit, an output selection circuit and an output pad. The driver circuit generates a plurality of voltage signals having the three or more voltage levels based on a power supply voltage, a ground voltage and at least one body bias voltage. The output selection circuit selects one of the plurality of voltage signals based on input data including two or more bits, and outputs the selected voltage signal as an output data signal that is the multi-level signal. The output pad is connected to the output selection circuit and outputs the output data signal. The driver circuit includes a first n-type metal oxide semiconductor (NMOS) transistor, a second NMOS transistor, a first p-type metal oxide semiconductor (PMOS) transistor and a second PMOS transistor. The first NMOS transistor is connected between the power supply voltage and the output pad, and receives a first body bias voltage. The second NMOS transistor is connected between the output pad and the ground voltage. The first PMOS transistor is connected between the power supply voltage and the output pad. The second PMOS transistor is connected between the output pad and the ground voltage, and receives a second body bias voltage different from the first body bias voltage.

According to example embodiments, a memory system that is configured to transmit data based on a multi-level signal having one of three or more voltage levels (that are different from each other) includes a memory controller, a memory device and a first channel. The memory controller includes a first transmitter and a first receiver. The first transmitter generates a first output data signal that is the multi-level signal based on first input data including two or more bits. The memory device includes a second transmitter and a second receiver. The second transmitter generates a second output data signal that is the multi-level signal based on second input data including two or more bits. The first channel connects the first transmitter and the first receiver with the second transmitter and the second receiver, and transmits the first and second output data signals. The first receiver receives the second output data signal, and the second receiver receives the first output data signal. The first transmitter includes a voltage selection circuit, a driver circuit and an output pad. The voltage selection circuit selects one of a plurality of driving voltages having different voltage levels based on the first input data. The driver circuit generates the first output data signal based on the selected driving voltage output from the voltage selection circuit. The output pad is connected to the driver circuit and outputs the first output data signal. Each of the plurality of driving voltages is a body bias voltage or a power supply voltage applied to a transistor included in the driver circuit.

According to example embodiments, a memory system configured to transmit data based on a multi-level signal having one of three or more voltage levels that are different from each other includes a memory controller, a memory device and a first channel. The memory controller includes a first transmitter and a first receiver. The first transmitter generates a first output data signal that is the multi-level signal based on first input data including two or more bits. The memory device includes a second transmitter and a second receiver. The second transmitter generates a second output data signal that is the multi-level signal based on second input data including two or more bits. The first channel connects the first transmitter and the first receiver with the second transmitter and the second receiver, and transmits the first and second output data signals. The first receiver receives the second output data signal, and the second receiver receives the first output data signal. The first transmitter includes a driver circuit, an output selection circuit and an output pad. The driver circuit generates a plurality of voltage signals having the three or more voltage levels based on a power supply voltage, a ground voltage and at least one body bias voltage. The output selection circuit selects one of the plurality of voltage signals based on the first input data, and outputs the selected voltage signal as the first output data signal. The output pad is connected to the output selection circuit and outputs the first output data signal. The driver circuit includes a plurality of drivers including transistors of different types. Each of the transistors is connected between the power supply voltage and the ground voltage. Transistors in different drivers may have different threshold voltages.

According to example embodiments, a transmitter configured to generate a multi-level signal having one of a first voltage level, a second voltage level, a third voltage level and a fourth voltage level that are different from each other includes a voltage selection circuit, a driver circuit and an output pad. The voltage selection circuit selects one of a first driving voltage corresponding to the first voltage level, a second driving voltage corresponding to the second voltage level, a third driving voltage corresponding to the third voltage level, and a fourth driving corresponding to the fourth voltage level, based on input data including a first bit and a second bit. The driver circuit includes at least one transistor, and generates an output data signal that is the multi-level signal based on a body effect by the transistor and one of the first, second, third and fourth driving voltages output from the voltage selection circuit. The output pad is connected to the driver circuit and outputs the output data signal. Each of the first, second, third and fourth driving voltages is a body bias voltage or a power supply voltage applied to the transistor included in the driver circuit. Among the first, second, third and fourth voltage levels, the first voltage level that is a lowest voltage level is higher than a voltage level of a ground voltage, and the fourth voltage level that is a highest voltage level is lower than a voltage level of the power supply voltage.

According to example embodiments, a transmitter configured to generate a multi-level signal having one of a first voltage level, a second voltage level, a third voltage level and a fourth voltage level includes a driver circuit, an output selection circuit and an output pad. The driver circuit includes transistors of different types that have different threshold voltages, and generates a first voltage signal having the first voltage level, a second voltage signal having the second voltage level, a third voltage signal having the third voltage level and a fourth voltage signal having the fourth voltage level based on a power supply voltage, a ground voltage, a body bias voltage and a body effect by the transistors. The output selection circuit selects one of the first, second, third and fourth voltage signals based on input data including a first bit and a second bit, and outputs the selected one of the first, second, third and fourth voltage signals as an output data signal that is the multi-level signal. The output pad is connected to the output selection circuit and outputs the output data signal. Among the first, second, third and fourth voltage levels, the first voltage level that is a lowest voltage level is higher than a voltage level of the ground voltage, and the fourth voltage level that is a highest voltage level is lower than a voltage level of the power supply voltage.

According to example embodiments, a transmitter configured to generate a multi-level signal having one of a first voltage level, a second voltage level, a third voltage level and a fourth voltage level that are different from each other includes a first n-type metal oxide semiconductor (NMOS) transistor, a second NMOS transistor, a first p-type metal oxide semiconductor (PMOS) transistor, a second PMOS transistor, a first output selection circuit, a second output selection circuit, a third output selection circuit, a fourth output selection circuit and an output pad. The first NMOS transistor is connected between a power supply voltage and the output pad, and receives a first body bias voltage. The second NMOS transistor is connected between the output pad and a ground voltage. The first PMOS transistor is connected between the power supply voltage and the output pad. The second PMOS transistor is connected between the output pad and the ground voltage, and receives a second body bias voltage. The first output selection circuit turns on the second NMOS transistor such that an output data signal that is the multi-level signal has the first voltage level when both a first bit and a second bit have a first value. The first and second bits are included in input data and different from each other. The second output selection circuit turns on the second PMOS transistor such that the output data signal has the second voltage level when the first bit has the first value and the second bit has a second value. The third output selection circuit turns on the first NMOS transistor such that the output data signal has the third voltage level when the first bit has the second value and the second bit has the first value. The fourth output selection circuit turns on the first PMOS transistor such that the output data signal has the fourth voltage level when both the first and second bits have the second value. The output pad outputs the output data signal. The first voltage level is a voltage level of the ground voltage, and the fourth voltage level is a voltage level of the power supply voltage.

In the transmitter and the memory system according to example embodiments, the driver circuit may generate the output data signal that is the multi-level signal based on the body effect of the transistor. Thus, the driver circuit may have a relatively simple structure without a plurality of pull-up drivers and a plurality of pull-down drivers, and may be implemented without a termination resistor connected to the output pad. Accordingly, the transmitter may generate the output data signal based on the multi-level signaling scheme and without using a termination resistor, and the DC current and the power consumption may be reduced.

BRIEF DESCRIPTION OF THE DRAWINGS

Illustrative, non-limiting example embodiments will be more clearly understood from the following detailed description taken in conjunction with the accompanying drawings.

FIGS. 9A and 9B are diagrams for describing an operation of a transmitter of FIG. 8.

FIGS. 11A and 11B are diagrams for describing an operation of a transmitter of FIG. 10.

FIGS. 16A and 16B are diagrams for describing an operation of a transmitter of FIG. 15.

FIG. 20 is a diagram for describing an operation of a transmitter of FIG. 19.

FIG. 22 is a diagram for describing an operation of a transmitter of FIG. 21.

FIG. 24 is a diagram for describing an operation of a transmitter of FIG. 23.

DETAILED DESCRIPTION OF THE EMBODIMENTS

Figure 1:
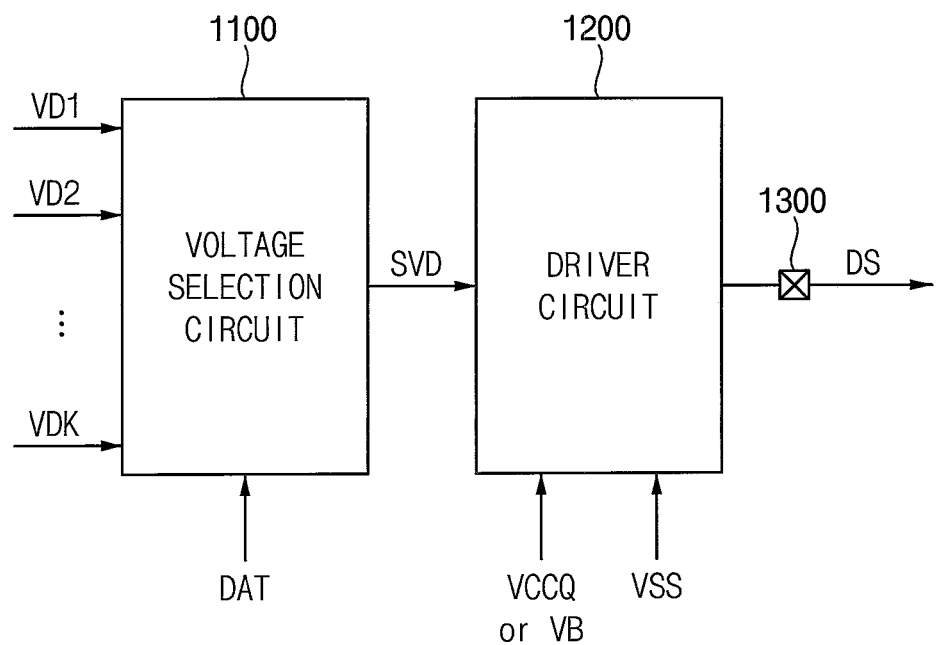
FIG. 1 is a block diagram illustrating a transmitter according to example embodiments.

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

FIG. 1 is a block diagram illustrating a transmitter according to example embodiments. Referring to FIG. 1, a transmitter 1000 includes a voltage selection circuit 1100, a driver circuit 1200 and an output pad (or output pin) 1300.

The transmitter 1000 generates and transmits a multi-level signal having one of three or more voltage levels that are different from each other during one unit interval (UI). The transmitter 1000 may be included in various communication systems and/or signal transmission systems, and may be included in, for example, a memory system. Configurations of the transmitter 1000, the memory system and the multi-level signal will be described in detail hereinbelow.

The voltage selection circuit 1100 selects one of a plurality of driving voltages VD1, VD2, VDK based on input data DAT, and outputs the selected driving voltage SVD, where K is a natural number greater than or equal to three. The input data DAT includes two or more bits. For example, the input data DAT may be multi-bit data for generating the multi-level signal. The plurality of driving voltages VD1, VD2, VDK are voltages used for operating the driver circuit 1200, and have different voltage levels.

For example, each of the plurality of driving voltages VD1, VD2, VDK may correspond to a respective one of the three or more voltage levels of the multi-level signal, and thus the number (e.g., K) of the plurality of driving voltages VD1, VD2, VDK may be substantially equal to the number of the three or more voltage levels of the multi-level signal (e.g., the number of voltage levels that the multi-level signal can have).

The driver circuit 1200 generates an output data signal DS that is the multi-level signal based on the selected driving voltage SVD output from the voltage selection circuit 1100, based on: (i) a power supply voltage VCCQ or a body bias voltage VB, and (ii) a ground voltage VSS. For example, the driver circuit 1200 may include at least one transistor, and the output data signal DS that is the multi-level signal may be generated based on or using a body effect by the transistor included in the driver circuit 1200.

In some example embodiments, as will be described with reference to FIG. 7, each of the plurality of driving voltages VD1, VD2, VDK and the selected driving voltage SVD may be a body bias voltage applied to a transistor included in the driver circuit 1200. In this example, the driver circuit 1200 may generate the output data signal DS based on a combination of the power supply voltage VCCQ, the ground voltage VSS and the selected driving voltage SVD.

In other example embodiments, as will be described with reference to FIG. 14, each of the plurality of driving voltages VD1, VD2, VDK and the selected driving voltage SVD may be a power supply voltage applied to a transistor included in the driver circuit 1200. In this example, the driver circuit 1200 may generate the output data signal DS based on a combination of the selected driving voltage SVD, the ground voltage VSS and the body bias voltage VB.

The output pad 1300 is connected to the driver circuit 1200, and outputs the output data signal DS. The output pad 1300 is not connected to a termination resistor. In other words, the output pad 1300 may be connected to the driver circuit 1200 without the termination resistor. Thus, a current level of a direct current (DC) flowing through the driver circuit 1200 may be lower than a reference current level. For example, a pad may be a contact pad or a contact pin, but example embodiments are not limited thereto.

In the transmitter 1000 according to example embodiments, the output data signal DS is generated based on a multi-level signaling scheme. The multi-level signaling scheme may be used as a means of compressing the bandwidth required to transmit data at a given bit rate. In a simple binary scheme, two single symbols, usually two voltage levels, may be used to represent '1' and '0,' and thus the symbol rate may be equal to the bit rate. In contrast, the principle of the multi-level signaling scheme may be to use a larger "alphabet" of m symbols to represent data, so that each symbol may represent more than one bit of data. As a result, the number of symbols that needs to be transmitted may be less than the number of bits (e.g., the symbol rate may be less than the bit rate), and thus the bandwidth may be compressed. The alphabet of symbols may be constructed from a number of different voltage levels. For example, in a four-level scheme, groups of two data bits may be mapped to one of four symbols. Only one symbol need be transmitted for each pair of data bits, so the symbol rate may be a half of the bit rate.

In other words, the multi-level signaling scheme may be used to increase a data transmission (or transfer) rate without increasing the frequency of data transmission and/or a transmission power of the communicated data. An example of one type of the multi-level signaling scheme may be a pulse amplitude modulation (PAM) scheme, where a unique symbol of a multi-level signal may represent a plurality of bits of data. The number of possible pulse amplitudes in a digital PAM scheme may be some power of two. For example, there may be $2^2$ possible discrete pulse amplitudes in a 4-level PAM (e.g., in PAM4), there may be $2^3$ possible discrete pulse amplitudes in an 8-level PAM (e.g., in PAM8), and there may be $2^4$ possible discrete pulse amplitudes in a 16-level PAM (e.g., in PAM16). However, example embodiments are not limited thereto, and example embodiments may be applied or employed to a K-level PAM (e.g., PAM(K)) having K possible pulse amplitudes, where K is a natural number greater than or equal to three.

A conventional transmitter that generates a data signal based on the multi-level signaling scheme includes a plurality of pull-up drivers and a plurality of pull-down drivers, and thus includes a termination resistor (e.g., an on-die termination (ODT) resistor) connected to an output pad. When the pull-up drivers are turned on, a DC current always flows through the termination resistor, thereby increasing power consumption in the conventional transmitter.

However, in the transmitter 1000 according to example embodiments, the driver circuit 1200 may generate the output data signal DS that is the multi-level signal based on the body effect of the transistor. Thus, the driver circuit 1200 may have a relatively simple structure without a plurality of pull-up drivers and a plurality of pull-down drivers, and may be implemented without a termination resistor connected to the output pad 1300. Accordingly, the transmitter 1000 may generate the output data signal DS based on the multi-level signaling scheme without the termination resistor, and the DC current and the power consumption may be reduced.

Figure 2:
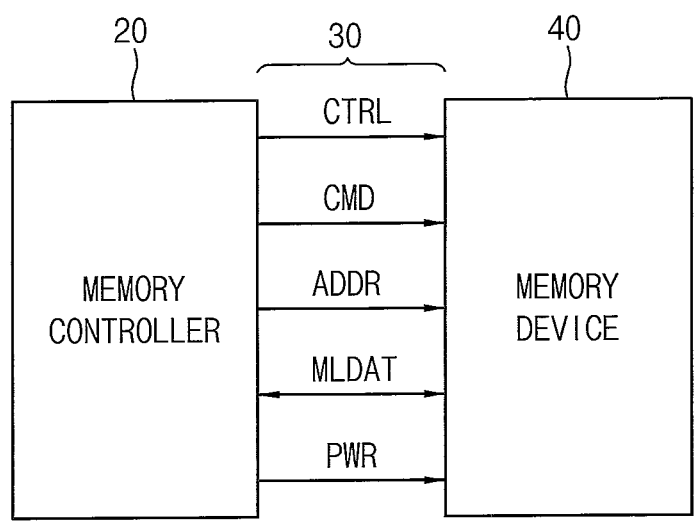
FIG. 2 is a block diagram illustrating a memory system according to example embodiments.

FIG. 2 is a block diagram illustrating a memory system 10 according to example embodiments. Referring to FIG. 2, a memory system 10 includes a memory controller 20 and a memory device 40. The memory system 10 may further include a plurality of signal lines 30 that electrically connect the memory controller 20 with the memory device 40. The memory device 40 is essentially controlled by the memory controller 20. For example, based on requests from a host (not illustrated), the memory controller 20 may store (e.g., write or program) data into the memory device 40, or may retrieve (e.g., read or sense) data from the memory device 40.

The plurality of signal lines 30 may include control lines, command lines, address lines, data input/output (I/O) lines and power lines, however, other lines (not shown) may also be provided. The memory controller 20 may transmit a command CMD, an address ADDR and a control signal CTRL to the memory device 40 via the command lines, the address lines and the control lines, may exchange a data signal MLDAT with the memory device 40 via the data I/O lines, and may transmit a power supply voltage PWR to the memory device 40 via the power lines. For example, the data signal MLDAT may be the multi-level signal that is generated and transmitted according to example embodiments. Although not illustrated in FIG. 2, the plurality of signal lines 30 may further include data strobe signal (DQS) lines for transmitting a DQS signal.

In some example embodiments, at least some or all of the signal lines 30 may be referred to as a channel. The term "channel" as used herein may represent signal lines that include the data I/O lines for transmitting the data signal MLDAT. However, example embodiments are not limited thereto, and the channel may further include the command lines for transmitting the command CMD and/or the address lines for transmitting the address ADDR.

Figure 3A:
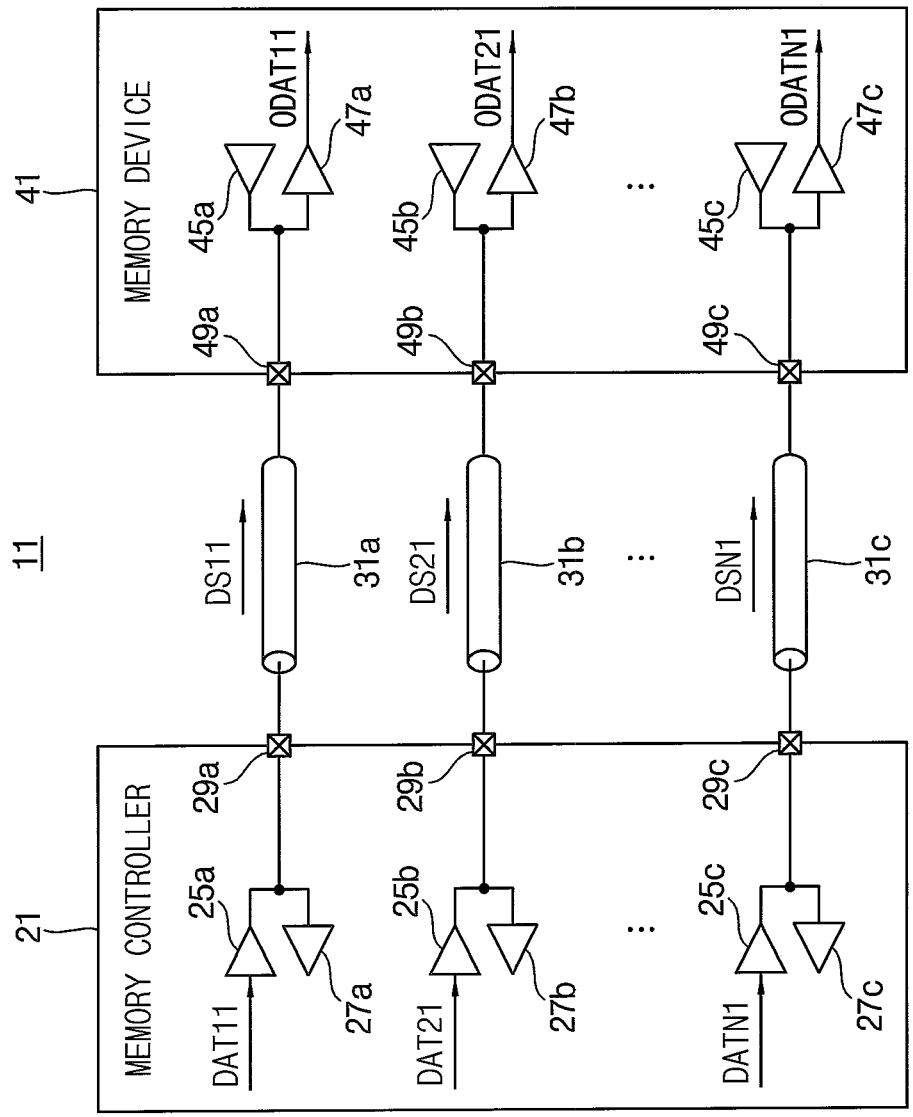
FIGS. 3A and 3B are block diagrams illustrating an example of a memory system of FIG. 2.
Figure 3B:
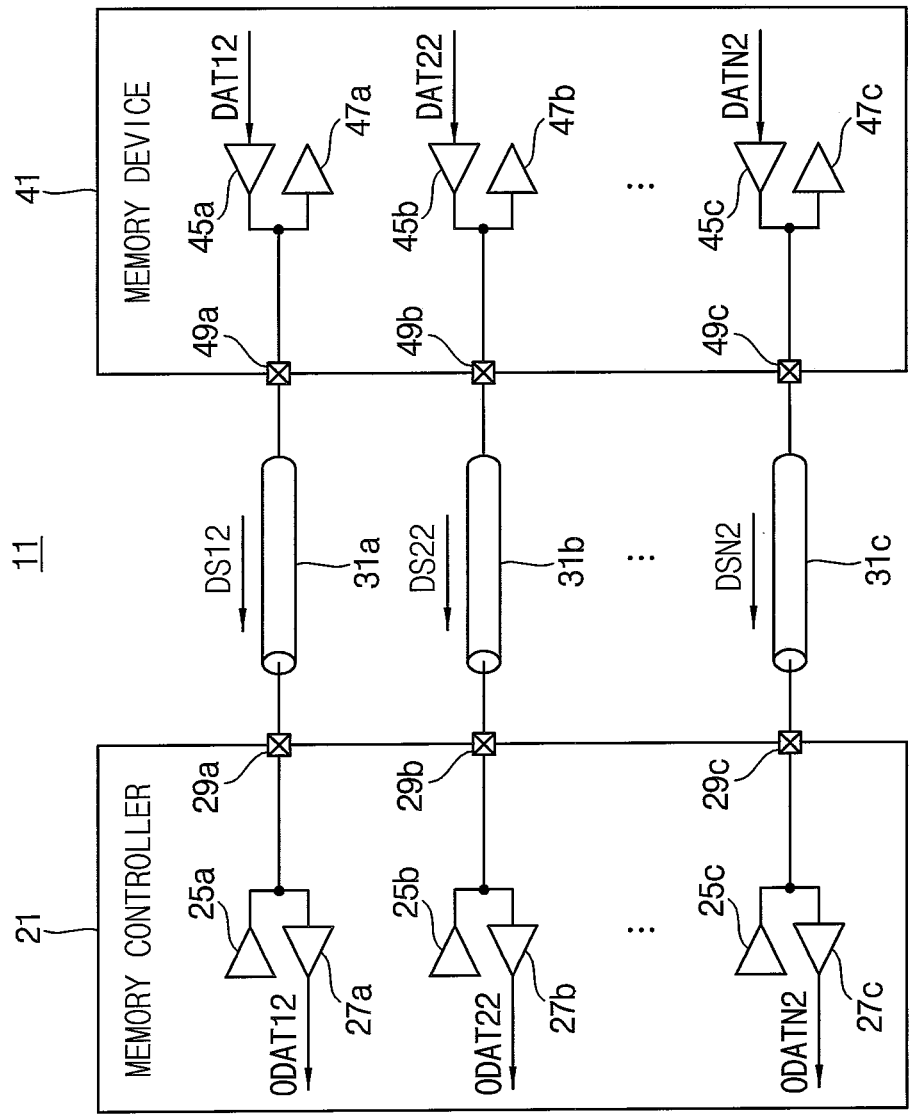

FIGS. 3A and 3B are block diagrams illustrating an example of the memory system of FIG. 2. Referring to FIGS. 3A and 3B, a memory system 11 includes a memory controller 21, a memory device 41 and a plurality of channels 31*a*, 31*b* and 31*c*. For example, the number of the channels 31*a*, 31*b* and 31*c* may be N, where N is a natural number greater than or equal to two. The memory controller 21 may include a plurality of transmitters 25*a*, 25*b* and 25*c*, a plurality of receivers 27*a*, 27*b* and 27*c*, and a plurality of data I/O pads 29*a*, 29*b* and 29*c*. The memory device 41 may include a plurality of transmitters 45*a*, 45*b* and 45*c*, a plurality of receivers 47*a*, 47*b* and 47*c*, and a plurality of data I/O pads 49*a*, 49*b* and 49*c*.

Each of the plurality of transmitters 25*a*, 25*b*, 25*c*, 45*a*, 45*b* and 45*c* may generate the multi-level signal, and may be the transmitter according to example embodiments. For example, each of the plurality of transmitters 25*a*, 25*b*, 25*c*, 45*a*, 45*b* and 45*c* may be the transmitter described with reference to FIG. 1 and may be implemented based on examples which will be described with reference to FIGS. 7 through 16. For another example, each of the plurality of transmitters 25*a*, 25*b*, 25*c*, 45*a*, 45*b* and 45*c* may be a transmitter which will be described with reference to FIG. 17 and may be implemented based on examples which will be described with reference to FIGS. 18 through 25. Each of the plurality of receivers 27*a*, 27*b*, 27*c*, 47*a*, 47*b* and 47*c* may receive the multi-level signal. And, each of the plurality of data I/O pads 29*a*, 29*b*, 29*c*, 49*a*, 49*b* and 49*c* may be connected to a respective one of the plurality of transmitters 25*a*, 25*b*, 25*c*, 45*a*, 45*b* and 45*c* and a respective one of the plurality of receivers 27*a*, 27*b*, 27*c*, 47*a*, 47*b* and 47*c*.

The plurality of channels 31*a*, 31*b* and 31*c* may connect the memory controller 21 with the memory device 41. Each of the plurality of channels 31*a*, 31*b* and 31*c* may be connected to a respective one of the plurality of transmitters 25*a*, 25*b* and 25*c* and a respective one of the plurality of receivers 27*a*, 27*b* and 27*c* through a respective one of the plurality of data I/O pads 29*a*, 29*b* and 29*c*. In addition, each of the plurality of channels 31*a*, 31*b* and 31*c* may be connected to a respective one of the plurality of transmitters 45*a*, 45*b* and 45*c* and a respective one of the plurality of receivers 47a, 47b and 47c through a respective one of the plurality of data I/O pads 49a, 49b and 49c. The multi-level signal may be transmitted through each of the plurality of channels 31a, 31b and 31c.

FIG. 3A illustrates an operation of transferring data from the memory controller 21 to the memory device 41. For example, the transmitter 25a may generate an output data signal DS11, which is the multi-level signal, based on input data DAT11. The output data signal DS11 may be transmitted from the memory controller 21 to the memory device 41 through the channel 31a, and the receiver 47a may receive the output data signal DS11 to obtain data ODAT11 corresponding to the input data DAT11. Similarly, the transmitter 25b may generate an output data signal DS21, which is the multi-level signal, based on input data DAT21. The output data signal DS21 may be transmitted to the memory device 41 through the channel 31b, and the receiver 47b may receive the output data signal DS21 to obtain data ODAT21 corresponding to the input data DAT21. The transmitter 25c may generate an output data signal DSN1, which is the multi-level signal, based on input data DATN1. The output data signal DSN1 may be transmitted to the memory device 41 through the channel 31c, and the receiver 47c may receive the output data signal DSN1 to obtain data ODATN1 corresponding to the input data DATN1. For example, the input data DAT11, DAT21 and DATN1 may be write data to be written into the memory device 41. Accordingly, the data I/O pads 29a, 29b and 29c may serve as output pads of the transmitters 25a, 25b and 25c, respectively.

FIG. 3B illustrates an operation of transferring data from the memory device 41 to the memory controller 21. For example, the transmitter 45a may generate an output data signal DS12, which is the multi-level signal, based on input data DAT12. The output data signal DS12 may be transmitted from the memory device 41 to the memory controller 21 through the channel 31a, and the receiver 27a may receive the output data signal DS12 to obtain data ODAT12 corresponding to the input data DAT12. Similarly, the transmitter 45b may generate an output data signal DS22, which is the multi-level signal, based on input data DAT22. The output data signal DS22 may be transmitted to the memory controller 21 through the channel 31b, and the receiver 27b may receive the output data signal DS22 to obtain data ODAT22 corresponding to the input data DAT22. The transmitter 45c may generate an output data signal DSN2, which is the multi-level signal, based on input data DATN2. The output data signal DSN2 may be transmitted to the memory controller 21 through the channel 31c, and the receiver 27c may receive the output data signal DSN2 to obtain data ODATN2 corresponding to the input data DATN2. For example, the input data DAT12, DAT22 and DATN2 may be read data retrieved from the memory device 41 in response to a read command provided by the memory controller. The data I/O pads 49a, 49b and 49c may serve as output pads of the transmitters 45a, 45b and 45c, respectively.

Figure 4:
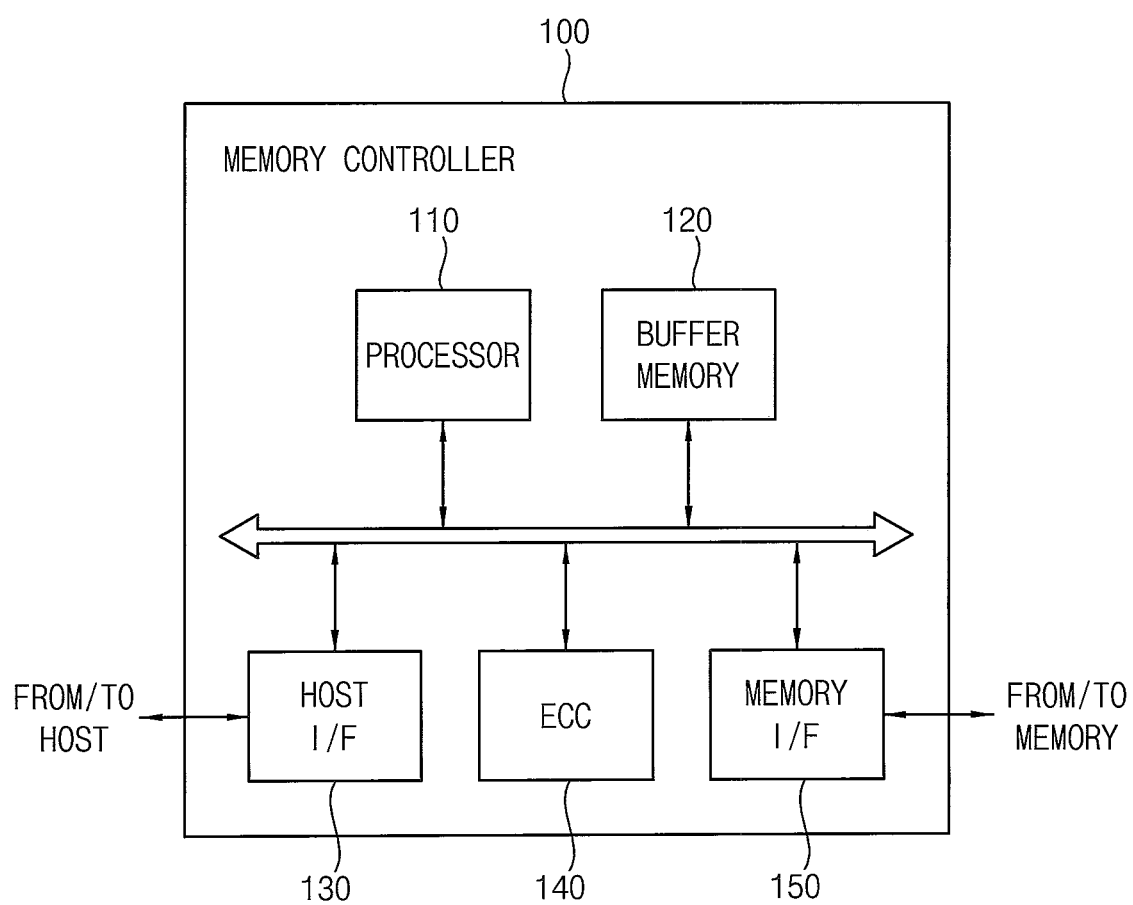
FIG. 4 is a block diagram illustrating an example of a memory controller included in a memory system according to example embodiments.

FIG. 4 is a block diagram illustrating an example of a memory controller included in a memory system according to example embodiments. Referring to FIG. 4, a memory controller 100 may include at least one processor 110, a buffer memory 120, a host interface 130, an error correction code (ECC) block 140, and a memory interface 150.

The processor 110 may control an operation of the memory controller 100 in response to a command and/or request received via the host interface 130 from an external host (not illustrated). For example, the processor 110 may control respective components by employing firmware for operating a memory device (e.g., the memory device 40 in FIG. 2). The buffer memory 120 may store instructions and data executed and processed by the processor 110. For example, the buffer memory 120 may be implemented with a high speed volatile memory device, such as a dynamic random access memory (DRAM), a static random access memory (SRAM), a cache memory, or the like.

The host interface 130 may provide physical connections between the host and the memory controller 100. The host interface 130 may provide an interface corresponding to a bus format of the host for communication between the host and the memory controller 100. In some example embodiments, the bus format of the host may be a small computer system interface (SCSI) or a serial attached SCSI (SAS) interface. In other example embodiments, the bus format of the host may be a USB, a peripheral component interconnect (PCI) express (PCIe), an advanced technology attachment (ATA), a parallel ATA (PATA), a serial ATA (SATA), a nonvolatile memory (NVM) express (NVMe), etc.

The ECC block 140 for error correction may perform coded modulation using a Bose-Chaudhuri-Hocquenghem (BCH) code, a low density parity check (LDPC) code, a turbo code, a Reed-Solomon code, a convolution code, a recursive systematic code (RSC), a trellis-coded modulation (TCM), a block coded modulation (BCM), etc., or may perform ECC encoding and ECC decoding using above-described codes or other error correction codes.

The memory interface 150 may exchange data with the memory device. The memory interface 150 may transmit a command and an address to the memory device, and may transmit data to the memory device or receive data read from the memory device. Although not illustrated in FIG. 4, a transmitter (e.g., the transmitter 25a in FIG. 3A), which generates the multi-level signal according to example embodiments, and a receiver (e.g., the receiver 27a in FIG. 3A), which receives the multi-level signal, may be utilized within the memory interface 150.

Figure 5A:
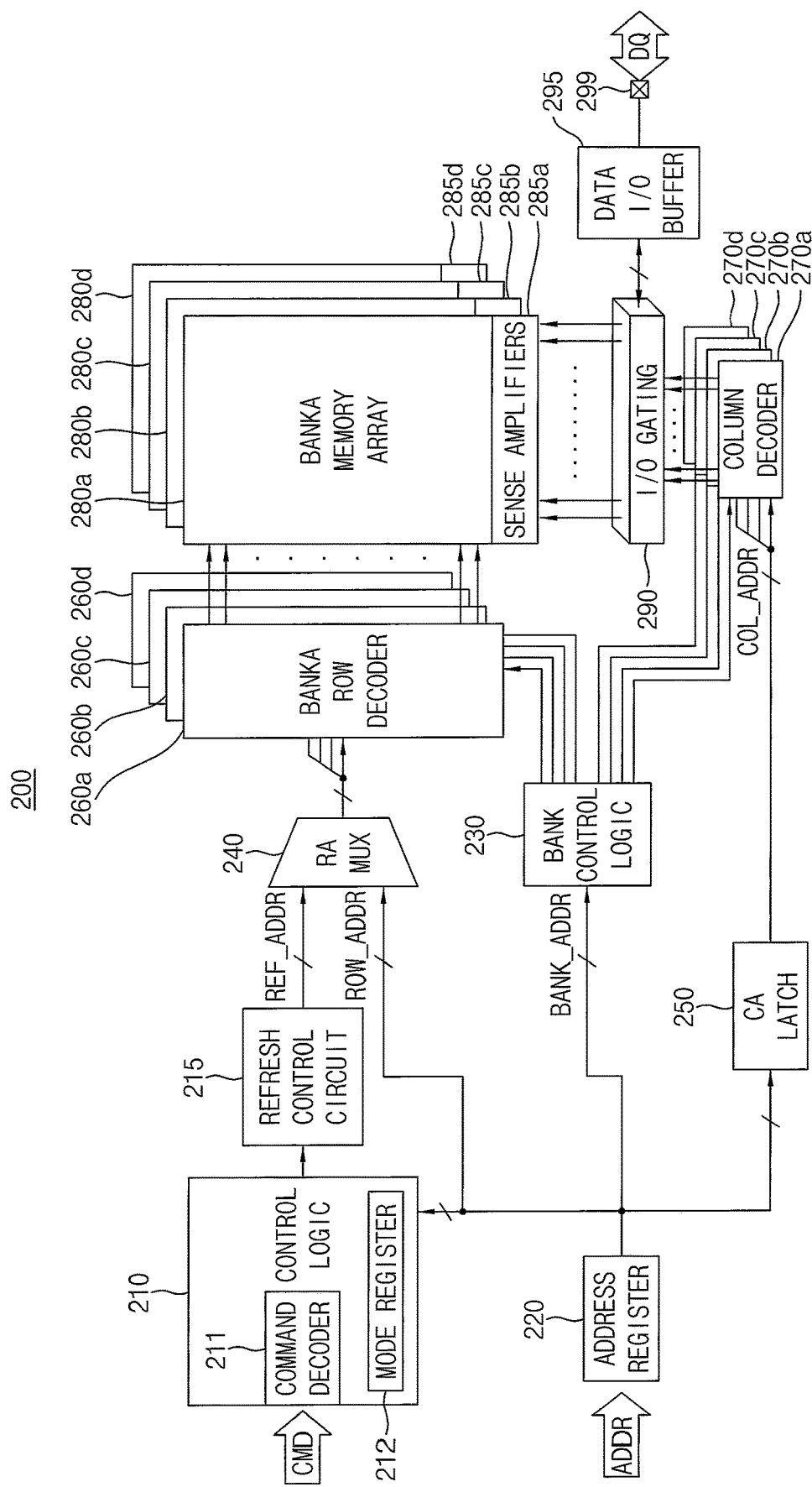
FIGS. 5A and 5B are block diagrams illustrating examples of a memory device included in a memory system according to example embodiments.
Figure 5B:
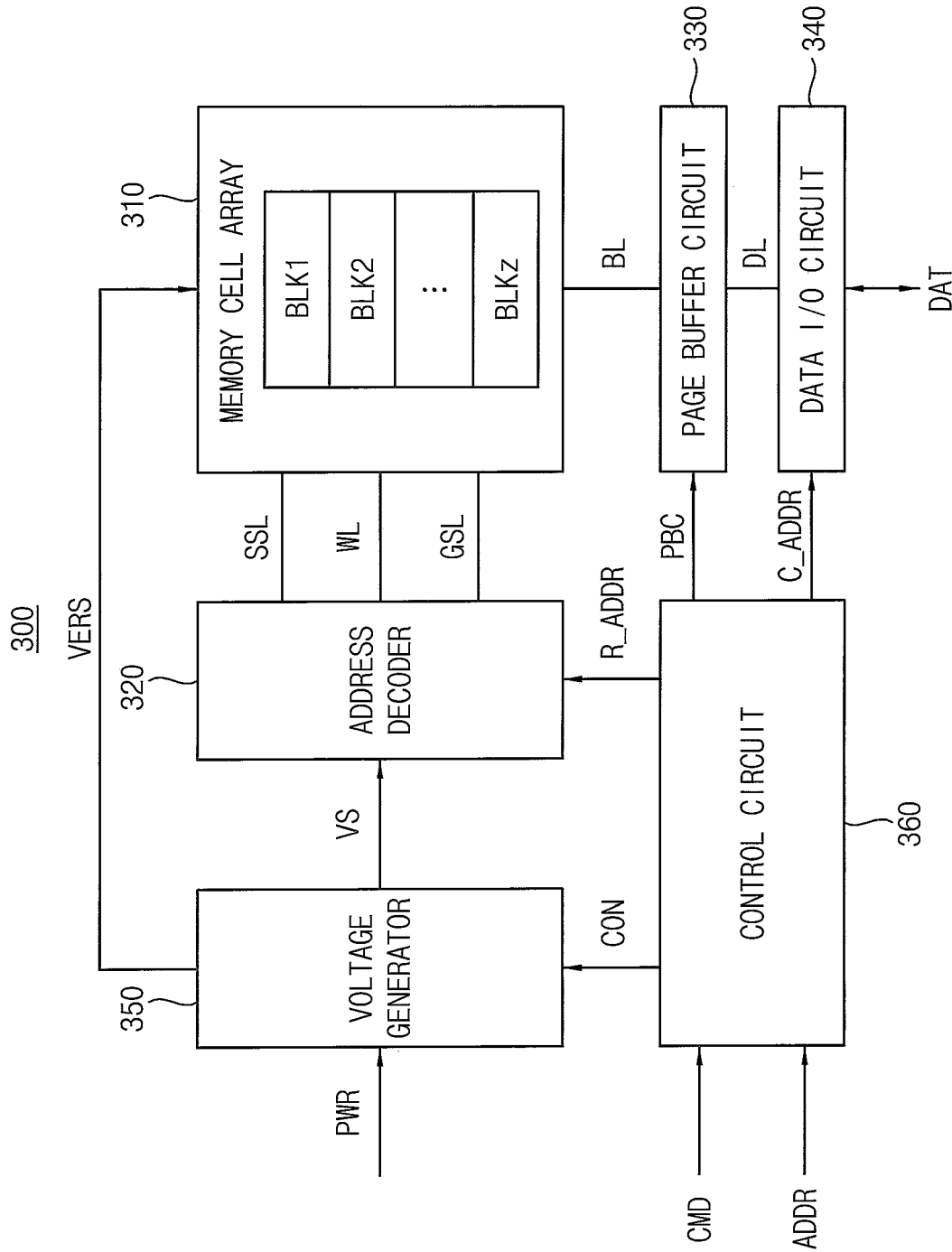

FIGS. 5A and 5B are block diagrams illustrating examples of a memory device included in a memory system according to example embodiments. Referring to FIG. 5A, a memory device 200 includes a control logic 210, a refresh control circuit 215, an address register 220, a bank control logic 230, a row address multiplexer 240, a column address latch 250, a row decoder, a column decoder, a memory cell array, a sense amplifier unit, an input/output (I/O) gating circuit 290, a data I/O buffer 295 and a data I/O pad 299. In some example embodiments, the memory device 200 may be a volatile memory device, such as a dynamic random access memory (DRAM).

The memory cell array may include a plurality of memory cells. The memory cell array may include a plurality of bank arrays, e.g., first through fourth bank arrays 280a, 280b, 280c and 280d. The row decoder may include a plurality of bank row decoders (e.g., first through fourth bank row decoders 260a, 260b, 260c and 260d), which are connected to the first through fourth bank arrays 280a, 280b, 280c and 280d, respectively. The column decoder may include a plurality of bank column decoders (e.g., first through fourth bank column decoders 270a, 270b, 270c and 270d) connected to the first through fourth bank arrays 280a, 280b, 280c and 280d, respectively. The sense amplifier unit may include a plurality of bank sense amplifiers, e.g., first through fourth bank sense amplifiers 285a, 285b, 285c and 285d connected to the first through fourth bank arrays 280a, 280b, 280c and 280d, respectively.

The first through fourth bank arrays 280a~280d, the first through fourth bank row decoders 260a-260d, the first through fourth bank column decoders 270a-270d, and the first through fourth bank sense amplifiers 285a-285d may form first through fourth banks, respectively. For example, the first bank array 280a, the first bank row decoder 260a, the first bank column decoder 270a, and the first bank sense amplifier 285a may form the first bank; the second bank array 280b, the second bank row decoder 260b, the second bank column decoder 270b, and the second bank sense amplifier 285b may form the second bank; the third bank array 280c, the third bank row decoder 260c, the third bank column decoder 270c, and the third bank sense amplifier 285c may form the third bank; and the fourth bank array 280d, the fourth bank row decoder 260d, the fourth bank column decoder 270d, and the fourth bank sense amplifier 285d may form the fourth bank.

The address register 220 may receive an address ADDR including a bank address BANK_ADDR, a row address ROW_ADDR and a column address COL_ADDR from a memory controller, such as the memory controller 20 in FIG. 2. The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to receipt of the bank address BANK_ADDR. One of the first through fourth bank row decoders 260a-260d corresponding to the received bank address BANK_ADDR may be activated in response to the bank control signals generated by the bank control logic 230, and one of the first through fourth bank column decoders 270a-270d corresponding to the received bank address BANK_ADDR may be activated in response to the bank control signals generated by the bank control logic 230.

The refresh control circuit 215 may generate a refresh address REF_ADDR in response to receipt of a refresh command or commencement of any self-refresh mode. For example, the refresh control circuit 215 may include a refresh counter that is configured to sequentially change the refresh address REF_ADDR from a first address of the memory cell array to a last address of the memory cell array. The refresh control circuit 215 may receive control signals from the control logic 210.

The row address multiplexer 240 may receive the row address ROW_ADDR from the address register 220, and may receive the refresh address REF_ADDR from the refresh control circuit 215. The row address multiplexer 240 may selectively output the row address ROW_ADDR or the refresh address REF_ADDR. A row address output from the row address multiplexer 240 (e.g., the row address ROW_ADDR or the refresh address REF_ADDR) may be applied to the first through fourth bank row decoders 260a-260d.

The activated one of the first through fourth bank row decoders 260a-260d may decode the row address output from the row address multiplexer 240, and may activate a wordline corresponding to the row address. For example, the activated bank row decoder may apply a wordline driving voltage to the wordline corresponding to the row address.

The column address latch 250 may receive the column address COL_ADDR from the address register 220, and may temporarily store the received column address COL_ADDR. The column address latch 250 may apply the temporarily stored or received column address COL_ADDR to the first through fourth bank column decoders 270a~270d. The activated one of the first through fourth bank column decoders 270a~270d may decode the column address COL_ADDR output from the column address latch 250, and may control the I/O gating circuit 290 to output data corresponding to the column address COL_ADDR.

The I/O gating circuit 290 may include circuitry for gating I/O data. For example, although not shown, the I/O gating circuit 290 may include an input data mask logic, read data latches for storing data output from the first through fourth bank arrays 280a~280d, and write drivers for writing data to the first through fourth bank arrays 280a~280d.

Data DQ to be read from one of the first through fourth bank arrays 280a~280d may be sensed by a sense amplifier coupled to the one bank array, and may be stored in the read data latches. The data DQ stored in the read data latches may be provided to the memory controller via the data I/O buffer 295 and the data I/O pad 299. Data DQ received via the data I/O pad 299, which are to be written to one of the first through fourth bank arrays 280a~280d, may be provided from the memory controller to the data I/O buffer 295. The data DQ received via the data I/O pad 299 and provided to the data I/O buffer 295 may be written to the one bank array via the write drivers in the I/O gating circuit 290. Although not illustrated in FIG. 5A, a transmitter (e.g., the transmitter 45a in FIG. 3A) that generates the multi-level signal according to example embodiments and a receiver (e.g., the receiver 47a in FIG. 3A) that receives the multi-level signal may be included in the data I/O buffer 295.

The control logic 210 may control an operation of the memory device 200. For example, the control logic 210 may generate control signals for the memory device 200 to perform a data write operation or a data read operation. The control logic 210 may include a command decoder 211 that decodes a command CMD received from the memory controller and a mode register 212 that sets an operation mode of the memory device 200.

Referring now to FIG. 5B, a memory device 300 may include a memory cell array 310, an address decoder 320, a page buffer circuit 330, a data input/output (I/O) circuit 340, a voltage generator 350 and a control circuit 360. For example, the memory device 300 may be one of various nonvolatile memory devices such as a NAND flash memory device.

The memory cell array 310 is connected to the address decoder 320 via a plurality of string selection lines SSL, a plurality of wordlines WL and a plurality of ground selection lines GSL. The memory cell array 310 is further connected to the page buffer circuit 330 via a plurality of bitlines BL. The memory cell array 310 may include a plurality of memory cells (e.g., a plurality of nonvolatile memory cells) that are connected to the plurality of wordlines WL and the plurality of bitlines BL. The memory cell array 310 may be divided into a plurality of memory blocks BLK1, BLK2, BLKz each of which includes memory cells.

In some example embodiments, the plurality of memory cells may be arranged in a two dimensional (2D) array structure or a three dimensional (3D) vertical array structure. A three-dimensional vertical array structure may include vertical cell strings that are vertically oriented such that at least one memory cell is located over another memory cell. The at least one memory cell may include a charge trap layer. The following patent documents, which are hereby incorporated by reference in their entirety, describe suitable configurations for a memory cell array including a 3D vertical array structure, in which the three-dimensional memory array is configured as a plurality of levels, with wordlines and/or bitlines shared between levels: U.S. Pat. Nos. 7,679,133; 8,553,466; 8,654,587; 8,559,235; and US Pat. Pub. No. 2011/0233648.

The control circuit 360 receives a command CMD and an address ADDR from the outside (e.g., from the memory controller 20 in FIG. 2), and control erasure, programming and read operations of the memory device 300 based on the command CMD and the address ADDR. An erasure operation may include performing a sequence of erase loops, and a program operation may include performing a sequence of program loops. Each program loop may include a program operation and at least one program verification operation. Each erase loop may include an erase operation and at least one erase verification operation. The read operation may include a normal read operation and data recovery read operation.

For example, the control circuit 360 may generate control signals CON, which are used for controlling the voltage generator 350, and may generate control signal PBC for controlling the page buffer circuit 330, based on the command CMD, and may generate a row address R_ADDR and a column address C_ADDR based on the address ADDR. The control circuit 360 may provide the row address R_ADDR to the address decoder 320 and may provide the column address C_ADDR to the data I/O circuit 340.

The address decoder 320 may be connected to the memory cell array 310 via the plurality of string selection lines SSL, the plurality of wordlines WL and the plurality of ground selection lines GSL. For example, during the data erase/write/read operations, the address decoder 320 may determine at least one of the plurality of wordlines WL as a selected wordline, at least one of the plurality of string selection lines SSL as a selected string selection line, and at least one of the plurality of ground selection lines GSL as a selected ground selection line, based on the row address R_ADDR.

The voltage generator 350 may generate voltages VS that are required for an operation of the memory device 300 based on a power PWR and the control signals CON. The voltages VS may be applied to the plurality of string selection lines SSL, the plurality of wordlines WL and the plurality of ground selection lines GSL via the address decoder 320. In addition, the voltage generator 350 may generate an erase voltage VERS that is required for the data erase operation based on the power PWR and the control signals CON.

The page buffer circuit 330 may be connected to the memory cell array 310 via the plurality of bitlines BL. The page buffer circuit 330 may include a plurality of page buffers. The page buffer circuit 330 may store data DAT to be programmed into the memory cell array 310 or may read data DAT sensed from the memory cell array 310. In other words, the page buffer circuit 330 may operate as a write driver or a sensing amplifier according to a corresponding write or read operation mode of the memory device 300.

The data I/O circuit 340 may be connected to the page buffer circuit 330 via data lines DL. The data I/O circuit 340 may provide the data DAT from the outside of the memory device 300 to the memory cell array 310 via the page buffer circuit 330 or may provide the data DAT from the memory cell array 310 to the outside of the memory device 300, based on the column address C_ADDR. Although not illustrated in FIG. 5B, a transmitter (e.g., the transmitter 45a in FIG. 3A) that generates the multi-level signal according to example embodiments and a receiver (e.g., the receiver 47a in FIG. 3A) that receives the multi-level signal may be included in the data I/O circuit 340.

In the examples of FIGS. 5A and 5B, the transmitter that generates the multi-level signal according to example embodiments may be implemented without a termination resistor. Thus, an on-die termination (ODT) circuit, which is connected to the data I/O pad 299 and the data I/O buffer 295 in FIG. 5A or is connected to the data I/O circuit 340 in FIG. 5B, may be omitted.

Although the memory device included in the memory system according to example embodiments is described based on a DRAM and a NAND flash memory, the memory device according to example embodiments may be any volatile memory device, and/or any nonvolatile memory device, e.g., a static random access memory (SRAM), a phase random access memory (PRAM), a resistive random access memory (RRAM), a nano floating gate memory (NFGM), a polymer random access memory (PoRAM), a magnetic random access memory (MRAM), a ferroelectric random access memory (FRAM), a thyristor random access memory (TRAM), etc.

Figure 6:
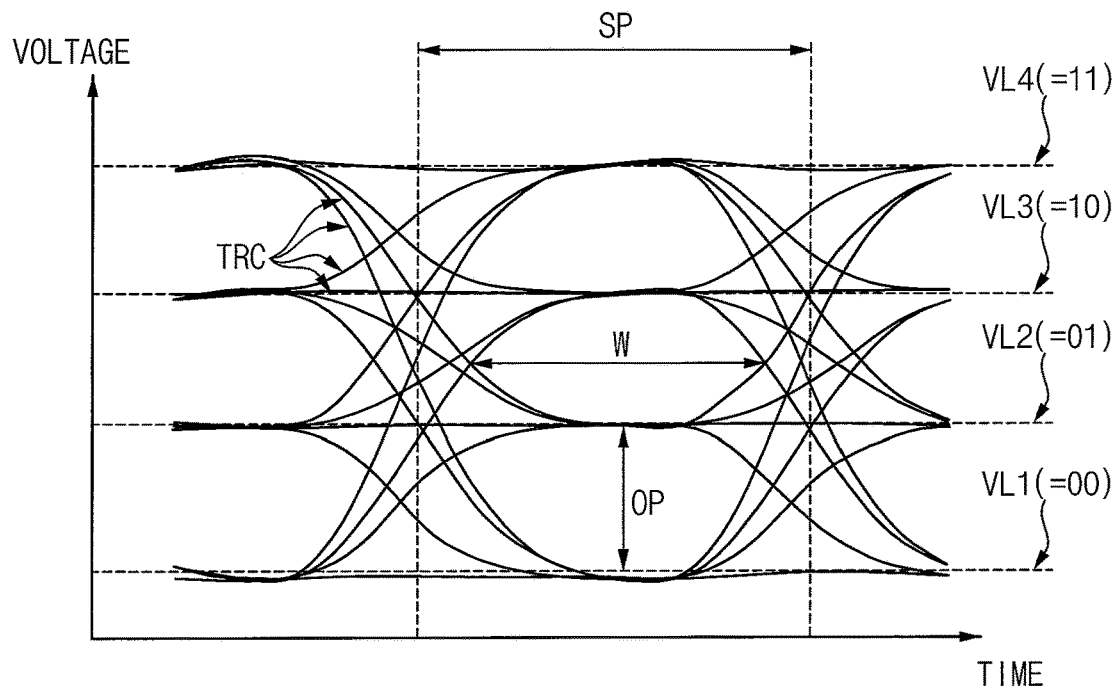
FIG. 6 is a diagram for describing an output data signal that is a multi-level signal and generated by a transmitter according to example embodiments.

FIG. 6 is a diagram for describing an output data signal that is a multi-level signal, which is generated by a transmitter according to example embodiments. Referring to FIG. 6, an ideal eye diagram of a data signal (e.g., a PAM4 signal) generated based on the 4-level scheme (e.g., the PAM4 scheme), which is an example of the multi-level signaling scheme (e.g., the PAM scheme), is illustrated. The eye diagram may be used to indicate the quality of signals in high-speed transmissions. For example, the eye diagram may represent four symbols of a signal (e.g., '00,' '01,' '10' and '11'), and each of the four symbols may be represented by a respective one of different voltage levels (e.g., voltage amplitudes) VL1, VL2, VL3 and VL4. The eye diagram may be used to provide a visual indication of the health of the signal integrity, and may indicate noise margins of the data signal.

To generate the eye diagram, an oscilloscope or other computing device may sample a digital signal according to a sample period SP (e.g., a unit interval or a bit period). The sample period SP may be defined by a clock associated with the transmission of the measured signal. The oscilloscope or other computing device may measure the voltage level of the signal during the sample period SP to form the plurality of traces TRC. Various characteristics associated with the measured signal may be determined by overlaying the plurality of traces TRC.

The eye diagram may be used to identify a number of characteristics of a communication signal such as jitter, cross talk, electromagnetic interference (EMI), signal loss, signal-to-noise ratio (SNR), other characteristics, or combinations thereof. For example, a width W of an eye in the eye diagram may be used to indicate a timing synchronization of the measured signal or jitter effects of the measured signal. For example, the eye diagram may indicate an eye opening OP, which represents a peak-to-peak voltage difference between the various voltage levels VL1, VL2, VL3 and VL4. As will be understood by those skilled in the art, the eye opening OP may be related to a voltage margin for discriminating between different voltage levels VL1, VL2, VL3 and VL4 of the measured signal.

Hereinafter, example embodiments will be described in detail based on the PAM4 scheme. However, example embodiments are not limited thereto, and example embodiments may be applied or employed to the PAM(K) scheme having K possible pulse amplitudes.

Figure 7:
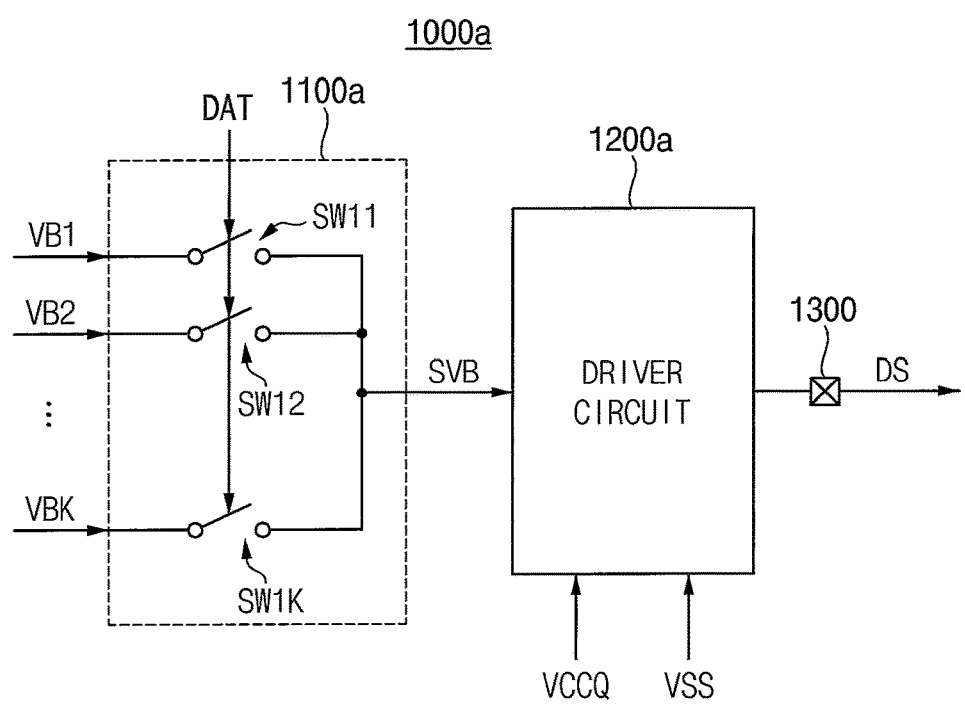
FIG. 7 is a block diagram illustrating an example of a transmitter of FIG. 1.

FIG. 7 is a block diagram illustrating an example of a transmitter of FIG. 1. Referring to FIG. 7, a transmitter 1000a includes a voltage selection circuit 1100a, a driver circuit 1200a and an output pad 1300. The voltage selection circuit 1100a may select one of a plurality of body bias voltages VB1, VB2, VBK based on the input data DAT, and may output the selected body bias voltage SVB. The plurality of body bias voltages VB1, VB2, VBK and the selected body bias voltage SVB may correspond to the plurality of driving voltages VD1, VD2, VDK and the selected driving voltage SVD in FIG. 1, respectively.

The voltage selection circuit 1100a may include a plurality of switches SW11, SW12, . . . , SW1K that are turned on and off based on the input data DAT. For example, only one switch may be enabled or activated based on a combination of the two or more bits included in the input data DAT. For example, when the switch SW11 is turned on, the first body bias voltage VB1 may be output as the selected body bias voltage SVB, and the remaining switches SW12, . . . , SW1K may be turned off.

The driver circuit 1200a may generate the output data signal DS based on the power supply voltage VCCQ, the ground voltage VSS and the selected body bias voltage SVB, and may output the output data signal DS through the output pad 1300. A voltage level of the output data signal DS may be changed depending on, or according to, a voltage level of the selected body bias voltage SVB. For example, as the voltage level of the selected body bias voltage SVB increases, the voltage level of the output data signal DS may decrease according to an inverse relationship.

Figure 8:
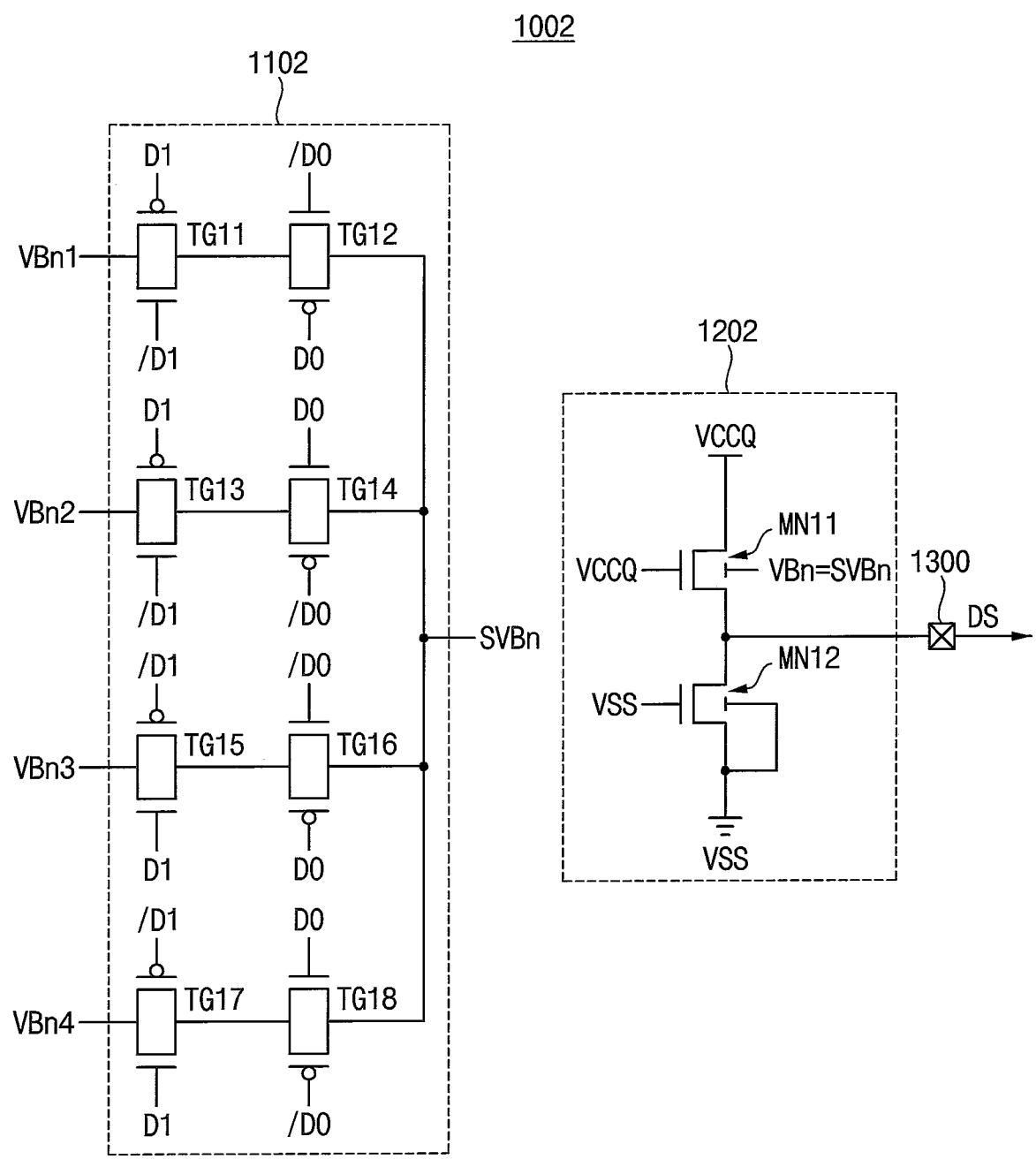
FIG. 8 is a circuit diagram illustrating an example of a transmitter of FIG. 7.

FIG. 8 is a circuit diagram illustrating an example of a transmitter of FIG. 7. FIGS. 9A and 9B are diagrams for describing an operation of a transmitter of FIG. 8.

Referring to FIGS. 8, 9A and 9B, a transmitter 1002 includes a voltage selection circuit 1102, a driver circuit 1202 and an output pad 1300. The voltage selection circuit 1102 may include four pairs of transmission gates: a first transmission gate TG11, a second transmission gate TG12, a third transmission gate TG13, a fourth transmission gate TG14, a fifth transmission gate TG15, a sixth transmission gate TG16, a seventh transmission gate TG17 and an eighth transmission gate TG18. As shown, the first and second transmission gates TG11 and TG12 may be connected in series between an input terminal of a first body bias voltage VBn1 and an output terminal of a selected body bias voltage SVBn. The third and fourth transmission gates TG13 and TG14 may be connected in series between an input terminal of a second body bias voltage VBn2 and the output terminal of the selected body bias voltage SVBn. The fifth and sixth transmission gates TG15 and TG16 may be connected in series between an input terminal of a third body bias voltage VBn3 and the output terminal of the selected body bias voltage SVBn. The seventh and eighth transmission gates TG17 and TG18 may be connected in series between an input terminal of a fourth body bias voltage VBn4 and the output terminal of the selected body bias voltage SVBn. The transmission gates TG11 through TG18 may be implemented as illustrated, and may receive a first bit D1 of the input data DAT, a second bit D0 of the input data DAT, an inverted first bit/D1 in which the first bit D1 is inverted, and an inverted second bit/D0 in which the second bit D0 is inverted. For example, the first bit D1 may be a most significant bit (MSB) of the input data DAT, and the second bit D0 may be a least significant bit (LSB) of the input data DAT.

In some example embodiments, as illustrated in FIG. 9A, when both the first and second bits D1 and D0 have a first value (e.g., "0"), the first and second transmission gates TG11 and TG12 may be turned on, and the first body bias voltage VBn1 may be output as the selected body bias voltage SVBn. Similarly, when the first bit D1 has the first value and the second bit D0 has a second value (e.g., "1"), the second body bias voltage VBn2 may be output as the selected body bias voltage SVBn. When the first bit D1 has the second value and the second bit D0 has the first value, the third body bias voltage VBn3 may be output as the selected body bias voltage SVBn. When both the first and second bits D1 and D0 have the second value, the fourth body bias voltage VBn4 may be output as the selected body bias voltage SVBn. The first, second, third and fourth body bias voltages VBn1, VBn2, VBn3 and VBn4 may correspond to the first, second, third and fourth voltage levels VL1, VL2, VL3 and VL4 in FIG. 6, respectively, and may be used to generate corresponding voltage levels.

However, in some alternative embodiments, the first body bias voltage VBn1 may have the highest voltage level, the second body bias voltage VBn2 may have a voltage level lower than that of the first body bias voltage VBn1, the third body bias voltage VBn3 may have a voltage level lower than that of the second body bias voltage VBn2, and the fourth body bias voltage VBn4 may have the lowest voltage level. The voltage levels of the body bias voltages VBn1, VBn2, VBn3 and VBn4 may be higher than a voltage level (e.g., about 0V) of the ground voltage VSS and lower than a voltage level of the power supply voltage VCCQ.

The driver circuit 1202 may include a first n-type metal oxide semiconductor (NMOS) transistor MN11 and a second NMOS transistor MN12. The driver circuit 1202 may be simply implemented with only two NMOS transistors, which are connected in series in a totem-pole arrangement.

The first NMOS transistor MN11 may be connected between the power supply voltage VCCQ and the output pad 1300, may have a gate electrode receiving the power supply voltage VCCQ, and may receive the selected body bias voltage SVBn as a body bias voltage VBn (i.e., below the channel region). In other words, the selected body bias voltage SVBn may be connected to a body of the first NMOS transistor MN11. The second NMOS transistor MN12 may be connected between the output pad 1300 and the ground voltage VSS, and may have a gate electrode receiving the ground voltage VSS. The ground voltage VSS may also be connected to a body of the second NMOS transistor MN12.

In some example embodiments, as illustrated in FIG. 9B, when the body bias voltage (VBn) is changed, such as when selected as: VBn1, VBn2, VBn3 or VBn4, a threshold voltage VTHn of the first NMOS transistor MN11 may be changed as VTHn1, VTHn2, VTHn3 and VTHn4, respectively. And, as a voltage level of the body bias voltage VBn increases, the threshold voltage VTHn of the first NMOS transistor MN11 may increase by a similar amount. Thus, when the first body bias voltage VBn1 has the highest voltage level, the threshold voltage VTHn1 may have the highest voltage level. Likewise, when the fourth body bias voltage VBn4 has the lowest voltage level, the threshold voltage VTHn4 may have the lowest voltage level.

In some example embodiments, as illustrated in FIG. 9B, the output data signal DS may have a voltage level corresponding to a "difference voltage" obtained by subtracting the threshold voltage VTHn of the first NMOS transistor MN11 from the power supply voltage VCCQ (i.e., the voltage of the gate electrode/terminal of MN11). When the threshold voltage VTHn of the first NMOS transistor MN11 is changed, such as VTHn1, VTHn2, VTHn3 and VTHn4, the voltage level of the output data signal DS may be changed, such as VCCQ-VTHn1, VCCQ-VTHn2, VCCQ-VTHn3 and VCCQ-VTHn4. Thus, as the voltage level of the body bias voltage VBn increases, the voltage level of the output data signal DS may decrease in an inverse relationship. For example, when the first body bias voltage VBn1 has the highest voltage level, the output data signal DS may have the voltage level VCCQ-VTHn1 that is the lowest voltage level. When the fourth body bias voltage VBn4 has the lowest voltage level, the output data signal DS may have the voltage level VCCQ-VTHn4 that is the highest voltage level.

In an example of FIGS. 8, 9A and 9B, when the voltage level of the output data signal DS is changed, such as VCCQ-VTHn1, VCCQ-VTHn2, VCCQ-VTHn3 and VCCQ-VTHn4, depending on the values of the first and second bits D1 and DO, the voltage levels VCCQ-VTHn1, VCCQ-VTHn2, VCCQ-VTHn3 and VCCQ-VTHn4 of the output data signal DS may correspond to the voltage levels VL1, VL2, VL3 and VL4 in FIG. 6, respectively.

In addition, in the example of FIGS. 8, 9A and 9B, all of the voltage levels VCCQ-VTHn1, VCCQ-VTHn2, VCCQ-VTHn3 and VCCQ-VTHn4 of the output data signal DS may be between the voltage level of the ground voltage VSS and the voltage level of the power supply voltage VCCQ. For example, the voltage level VCCQ-VTHn1 that is the lowest voltage level may be higher than the voltage level of the ground voltage VSS, and the voltage level VCCQ-VTHn4 that is the highest voltage level may be lower than the voltage level of the power supply voltage VCCQ.

Figure 10:
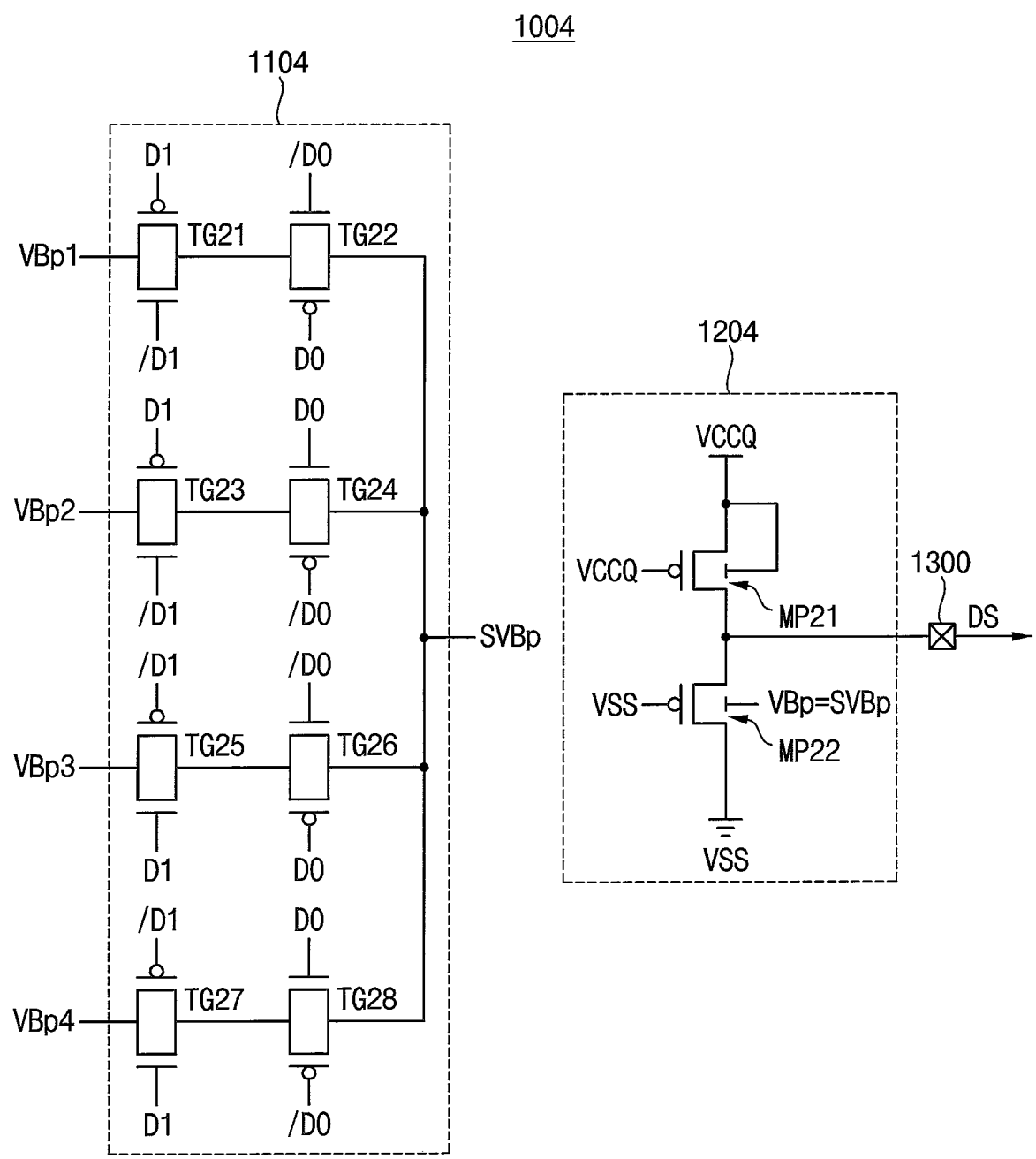
FIG. 10 is a circuit diagram illustrating an example of a transmitter of FIG. 7.

FIG. 10 is a circuit diagram illustrating an example of a transmitter of FIG. 7. FIGS. 11A and 11B are diagrams for describing an operation of a transmitter of FIG. 10. The descriptions repeated with FIGS. 8, 9A and 9B will be omitted. Referring to FIGS. 10, 11A and 11B, a transmitter 1004 includes a voltage selection circuit 1104, a driver circuit 1204 and an output pad 1300. The transmitter 1004 may be substantially the same as the transmitter 1002 in FIG. 8, except that the driver circuit 1204 is implemented with a pair of serially-connected p-type metal oxide semiconductor (PMOS) transistors and a voltage configuration is changed to accommodate the complementary type of transistors (i.e., PMOS versus NMOS).

The voltage selection circuit 1104 may include first, second, third, fourth, fifth, sixth, seventh and eighth transmission gates TG21, TG22, TG23, TG24, TG25, TG26, TG27 and TG28. The transmission gates TG21 through TG28 may be implemented substantially the same as the transmission gates TG11 through TG18 in FIG. 8, and may output one of first, second, third and fourth body bias voltages VBp1, VBp2, VBp3 and VBp4 as a selected body bias voltage SVBp, based on the first and second bits D1 and D0 of the input data DAT, as illustrated in FIG. 11A.

In some example embodiments, the first body bias voltage VBp1 may have the highest voltage level, the second body bias voltage VBp2 may have a second highest voltage level lower than that of the first body bias voltage VBp1, the third body bias voltage VBp3 may have a third highest voltage level lower than that of the second body bias voltage VBp2, and the fourth body bias voltage VBp4 may have the lowest voltage level. The voltage levels of the body bias voltages VBp1, VBp2, VBp3 and VBp4 may be higher than the voltage level of the ground voltage VSS and lower than the voltage level of the power supply voltage VCCQ.

The driver circuit 1204 may include a first PMOS transistor MP21 and a second PMOS transistor MP22. Thus, the driver circuit 1204 may be simply implemented with only two PMOS transistors, which are connected in series in a totem-pole arrangement (between VCCQ and VSS). As shown, the first PMOS transistor MP21 may be connected between the power supply voltage VCCQ and the output pad 1300, and may have a gate electrode receiving the power supply voltage VCCQ. The second PMOS transistor MP22 may be connected between the output pad 1300 and the ground voltage VSS, may have a gate electrode receiving the ground voltage VSS, and may receive the selected body bias voltage SVBp as a body bias voltage VBp. In other words, the selected body bias voltage SVBp may be connected to a body of the second PMOS transistor MP22. The power supply voltage VCCQ may be connected to a body of the first PMOS transistor MP21.

In some example embodiments, as illustrated in FIG. 11B, when the body bias voltage VBp is changed between VBp1, VBp2, VBp3 and VBp4, a threshold voltage VTHp of the second PMOS transistor MP22 may be changed between VTHp1, VTHp2, VTHp3 and VTHp4. As a voltage level of the body bias voltage VBp increases, the threshold voltage VTHp of the second PMOS transistor MP22 may decrease. For example, when the first body bias voltage VBp1 has the highest voltage level, the threshold voltage VTHp1 may have the lowest voltage level. When the fourth body bias voltage VBp4 has the lowest voltage level, the threshold voltage VTHp4 may have the highest voltage level.

In some example embodiments, as illustrated in FIG. 11B, the output data signal DS may have a voltage level corresponding to the threshold voltage VTHp of the second PMOS transistor MP22. When the threshold voltage VTHp of the second PMOS transistor MP22 is changed between VTHp1, VTHp2, VTHp3 and VTHp4, the voltage level of the output data signal DS may be changed between VTHp1, VTHp2, VTHp3 and VTHp4. Thus, as the voltage level of the body bias voltage VBp increases, the voltage level of the output data signal DS may decrease. For example, when the first body bias voltage VBp1 has the highest voltage level, the output data signal DS may have the voltage level VTHp1 that is the lowest voltage level. In contrast, when the fourth body bias voltage VBp4 has the lowest voltage level, the output data signal DS may have the voltage level VTHp4, which is the highest voltage level.

Similar to that described with reference to FIGS. 9A and 9B, in an example of FIGS. 10, 11A and 11B, the voltage levels VTHp1, VTHp2, VTHp3 and VTHp4 of the output data signal DS may correspond to the voltage levels VL1, VL2, VL3 and VL4 in FIG. 6, respectively, and all of the voltage levels VTHp1, VTHp2, VTHp3 and VTHp4 may be between the voltage level of the ground voltage VSS and the voltage level of the power supply voltage VCCQ. For example, the voltage level VTHp1 that is the lowest voltage level may be higher than the voltage level of the ground voltage VSS, and the voltage level VTHp4 that is the highest voltage level may be lower than the voltage level of the power supply voltage VCCQ.

Figure 12:
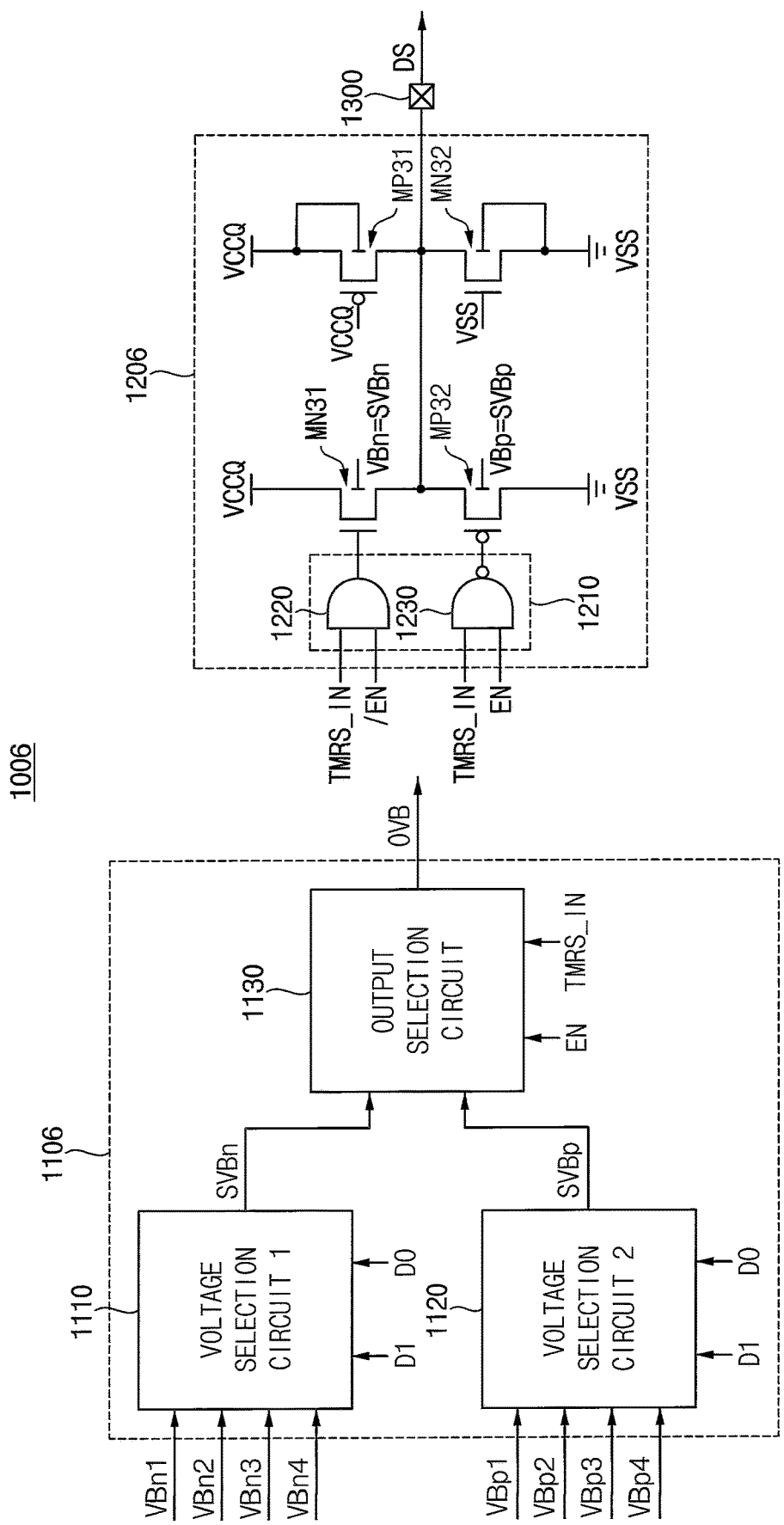
FIG. 12 is a circuit diagram illustrating an example of a transmitter of FIG. 7.
Figures 13, 14:
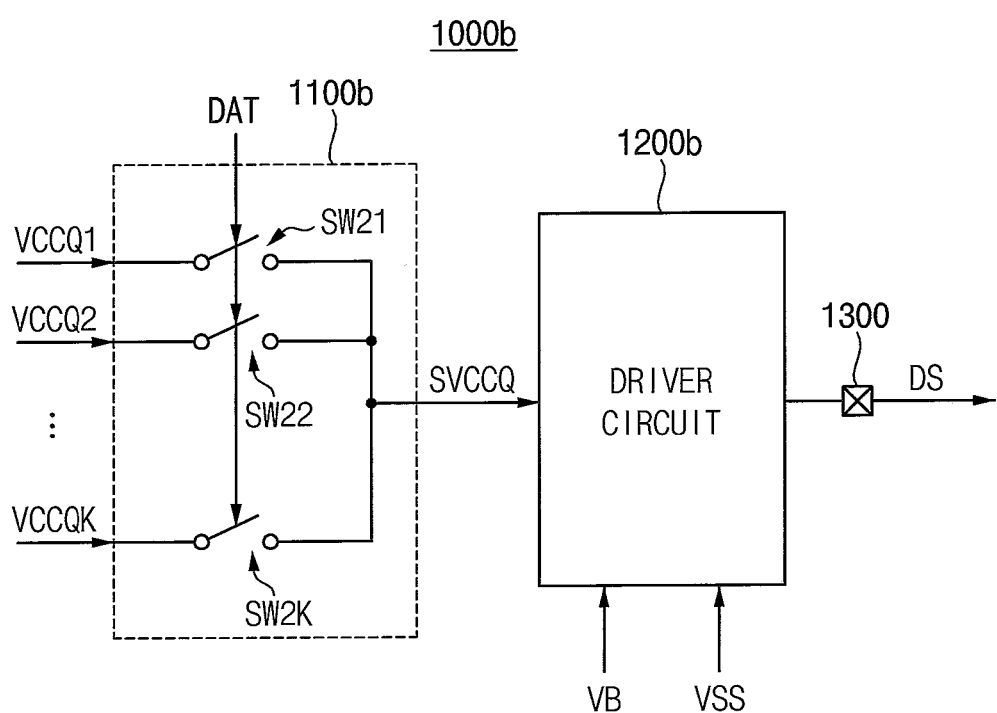
FIG. 13 is a diagram for describing an operation of a transmitter of FIG. 12.
FIG. 14 is a block diagram illustrating an example of a transmitter of FIG. 1.

FIG. 12 is a circuit diagram illustrating an example of a transmitter of FIG. 7; and FIG. 13 is a diagram for describing an operation of a transmitter of FIG. 12. The descriptions in common with those of FIGS. 8, 9A, 9B, 10, 11A and 11B will be omitted. Referring to FIGS. 12 and 13, a transmitter 1006 includes a voltage selection circuit 1106, a driver circuit 1206 and an output pad 1300.

The driver circuit 1206 may have a form in which the driver circuit 1202 in FIG. 8 and the driver circuit 1204 in FIG. 10 are combined, and a configuration for selecting one of the driver circuits 1202 and 1204 may be added. Similarly, the voltage selection circuit 1106 may have a form in which the voltage selection circuit 1102 in FIG. 8 and the voltage selection circuit 1104 in FIG. 10 are combined, and a configuration for selecting one of the voltage selection circuits 1102 and 1104 may be added.

The voltage selection circuit 1106 may include a first voltage selection circuit 1110, a second voltage selection circuit 1120 and an output selection circuit 1130, coupled as illustrated. The first voltage selection circuit 1110 may be substantially the same as the voltage selection circuit 1102 in FIG. 8, and the second voltage selection circuit 1120 may be substantially the same as the voltage selection circuit 1104 in FIG. 10. The "final stage" output selection circuit 1130 may provide the selected body bias voltage SVBn or the selected body bias voltage SVBp as an output body bias voltage OVB based on an enable signal EN and a setting signal TMRS_IN, or may block an output of the body bias voltage.

The driver circuit 1206 may include a first NMOS transistor MN31, a second NMOS transistor MN32, a first PMOS transistor MP31, a second PMOS transistor MP32 and a selector 1210. The first and second NMOS transistors MN31 and MN32 may be substantially the same as the first and second NMOS transistors MN11 and MN12 in FIG. 8, respectively. The first and second PMOS transistors MP31 and MP32 may be substantially the same as the first and second PMOS transistors MP21 and MP22 of FIG. 10, respectively.

The multi-gate selector 1210 may select and drive the first and second NMOS transistors MN31 and MN32, or may select and drive the first and second PMOS transistors MP31 and MP32, based on the enable signal EN and the setting signal TMRS_IN. The selector 1210 may include an AND gate 1220 and a NAND gate 1230.

The AND gate 1220 may have a first input terminal receiving the setting signal TMRS_IN, a second input terminal receiving an inverted enable signal/EN in which the enable signal EN is inverted, and an output terminal connected to a gate electrode of the first NMOS transistor MN31. The AND gate 1220 may selectively turn on the first NMOS transistor MN31 based on a result of an AND operation on the setting signal TMRS_IN and the inverted enable signal/EN.

In contrast, the NAND gate 1230 may have a first input terminal receiving the setting signal TMRS_IN, a second input terminal receiving the enable signal EN, and an output terminal connected to a gate electrode of the second PMOS transistor MP32. The NAND gate 1230 may selectively turn on the second PMOS transistor MP32 based on a result of a NAND operation on the setting signal TMRS_IN and the enable signal EN.

In some example embodiments, as illustrated by the truth table of FIG. 13, when the setting signal TMRS_IN has a first value (e.g., "0"), the driver circuit 1206 may be disabled or deactivated regardless of a value of the enable signal EN, and the output selection circuit 1130 may block the output of the body bias voltage. But, when the setting signal TMRS_IN corresponds to the power supply voltage VCCQ and the enable signal EN has a second value (e.g., "1"), the first and second PMOS transistors MP31 and MP32 may be turned on, and the transmitter 1006 may operate as described with reference to FIGS. 10, 11A and 11B. In contrast, when the setting signal TMRS_IN corresponds to the power supply voltage VCCQ and the enable signal EN has the first value, the first and second NMOS transistors MN31 and MN32 may be turned on, and the transmitter 1006 may operate as described with reference to FIGS. 8, 9A and 9B.

FIG. 14 is a block diagram illustrating an example of a transmitter of FIG. 1. The descriptions repeated with FIG. 7 will be omitted. Referring to FIG. 14, a transmitter 1000*b* includes a voltage selection circuit 1100*b*, a driver circuit 1200*b* and an output pad 1300. The voltage selection circuit 1100*b* may select one of a plurality of power supply voltages VCCQ1, VCCQ2, VCCQK based on the input data DAT, and may output the selected power supply voltage as signal SVCCQ. The plurality of power supply voltages VCCQ1, VCCQ2, VCCQK and the selected power supply voltage SVCCQ may correspond to the plurality of driving voltages VD1, VD2, VDK and the selected driving voltage SVD in FIG. 1, respectively.

The voltage selection circuit 1100*b* may include a plurality of switches SW21, SW22, SW2K that are turned on and off based on the input data DAT. The switches SW21 through SW2K may be substantially the same as the switches SW11 through SW1K in FIG. 7. The next stage, the driver circuit 1200*b*, may generate the output data signal DS based on the selected power supply voltage SVCCQ, the ground voltage VSS and the body bias voltage VB. A voltage level of the output data signal DS may be changed depending on a voltage level of the selected power supply voltage SVCCQ. For example, as the voltage level of the selected power supply voltage SVCCQ increases, the voltage level of the output data signal DS may increase.

Figure 15:
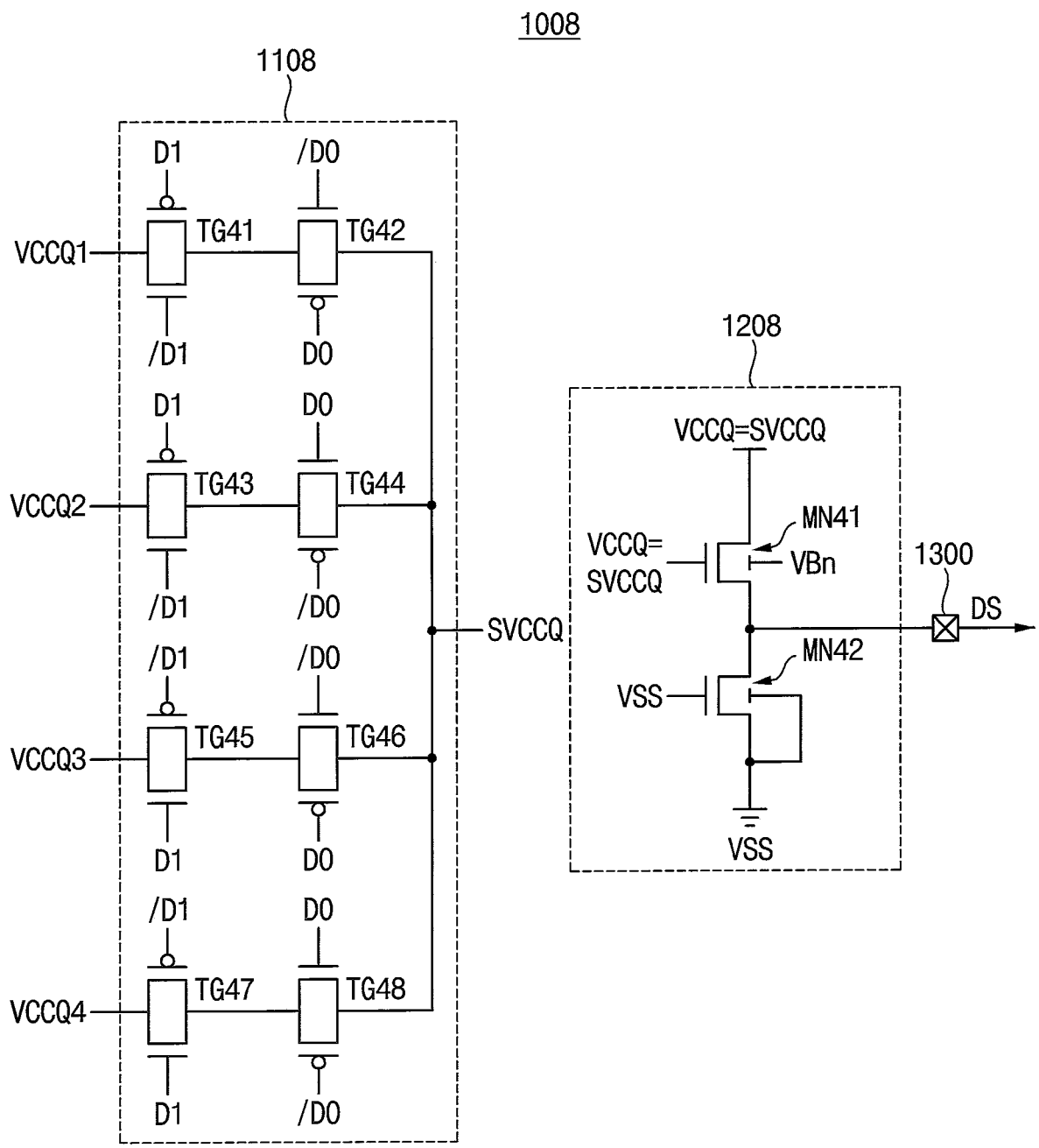
FIG. 15 is a circuit diagram illustrating an example of a transmitter of FIG. 14.

FIG. 15 is a circuit diagram illustrating an example of a transmitter of FIG. 14; and FIGS. 16A and 16B are diagrams for describing an operation of a transmitter of FIG. 15. The descriptions repeated with FIGS. 8, 9A and 9B will be omitted.

Referring to FIGS. 15, 16A and 16B, a transmitter 1008 includes a voltage selection circuit 1108, a driver circuit 1208 and an output pad 1300. The voltage selection circuit 1108 may include first, second, third, fourth, fifth, sixth, seventh and eighth transmission gates TG41, TG42, TG43, TG44, TG45, TG46, TG47 and TG48. The transmission gates TG41 through TG48 may be implemented substantially the same as the transmission gates TG11 through TG18 in FIG. 8, and may output one of first, second, third and fourth power supply voltages VCCQ1, VCCQ2, VCCQ3 and VCCQ4 as the selected power supply voltage SVCCQ based on the first and second bits D1 and D0, as illustrated in FIG. 16A.

In some example embodiments, the first power supply voltage VCCQ1 may have the lowest voltage level, the second power supply voltage VCCQ2 may have a voltage level higher than that of the first power supply voltage VCCQ1, the third power supply voltage VCCQ3 may have a voltage level higher than that of the second power supply voltage VCCQ2, and the fourth power supply voltage VCCQ4 may have the highest voltage level.

The driver circuit 1208 may include a first NMOS transistor MN41 and a second NMOS transistor MN42. These first and second NMOS transistors MN41 and MN42 may be similar to the first and second NMOS transistors MN11 and MN12 in FIG. 8, respectively. However, unlike the first and second NMOS transistors MN11 and MN12 in FIG. 8, the power supply voltage VCCQ applied to the gate and drain of the first NMOS transistor MN41 may have a variable voltage level (VCCQ=SVCCQ), and the body bias voltage VBn applied to the first NMOS transistor MN41 may have a fixed voltage level. When the body bias voltage VBn has the fixed voltage level, a threshold voltage VTHn of the first NMOS transistor MN41 may also have a fixed voltage level.

In some example embodiments, as illustrated in FIG. 16B, the output data signal DS may have a voltage level corresponding to a difference voltage obtained by subtracting the threshold voltage VTHn of the first NMOS transistor MN41 from the power supply voltage VCCQ. However, when the power supply voltage VCCQ is changed to a different value, such as VCCQ1, VCCQ2, VCCQ3 and VCCQ4, the voltage level of the output data signal DS may be changed, such as VCCQ1-VTHn, VCCQ2-VTHn, VCCQ3-VTHn and VCCQ4-VTHn, because the output data signal DS is clamped to these maximum values once MN41 turns off (when acting as a pull-up transistor). Thus, as the voltage level of the power supply voltage VCCQ increases, the voltage level of the output data signal DS may increase. For example, when the first power supply voltage VCCQ1 has the lowest voltage level, the output data signal DS may have the voltage level VCCQ1-VTHn that is the lowest voltage level. When the fourth power supply voltage VCCQ4 has the highest voltage level, the output data signal DS may have the voltage level VCCQ4-VTHn that is the highest voltage level.

Similar to that described with reference to FIGS. 9A and 9B, in an example of FIGS. 15, 16A and 16B, the voltage levels VCCQ1-VTHn, VCCQ2-VTHn, VCCQ3-VTHn and VCCQ4-VTHn of the output data signal DS may correspond to the voltage levels VL1, VL2, VL3 and VL4 in FIG. 6, respectively, and all of the voltage levels VCCQ1-VTHn, VCCQ2-VTHn, VCCQ3-VTHn and VCCQ4-VTHn may be between the voltage level of the ground voltage VSS and the voltage level of the power supply voltage VCCQ. For example, the voltage level VCCQ1-VTHn, which is the lowest voltage level, may be higher than the voltage level of the ground voltage VSS, and the voltage level VCCQ4-VTHn, which is the highest voltage level, may be lower than the voltage level of the power supply voltage VCCQ.

Figure 17:
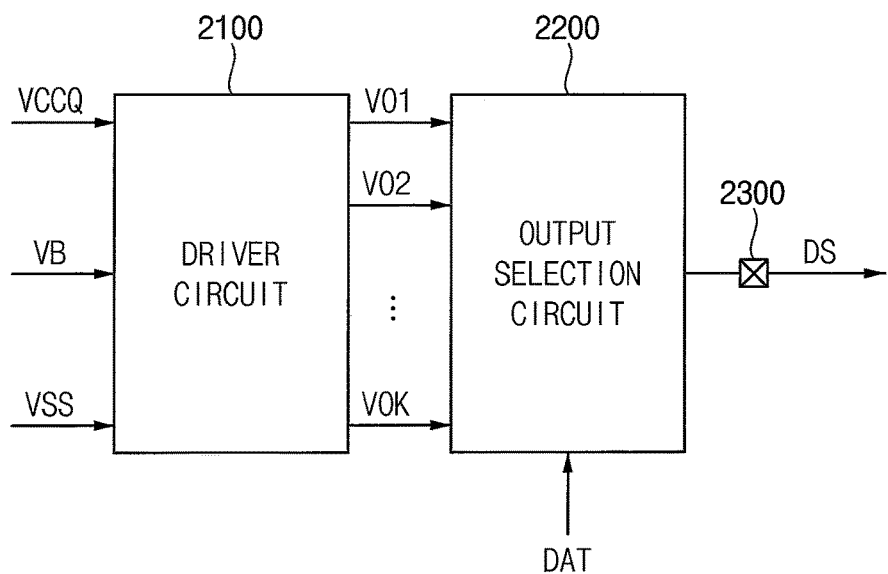
FIG. 17 is a block diagram illustrating a transmitter according to example embodiments.

FIG. 17 is a block diagram illustrating a transmitter 2000 according to example embodiments. The descriptions that correspond to descriptions previously provided with respect to FIG. 1 will be omitted. Referring to FIG. 17, a transmitter 2000 includes a driver circuit 2100, an output selection circuit 2200, and an output pad 2300.

The driver circuit 2100 generates a plurality of voltage signals VO1, VO2, . . . , VOK having the three or more voltage levels based on a power supply voltage VCCQ, a ground voltage VSS and at least one body bias voltage VB, where K is a natural number greater than or equal to three. For example, each of the plurality of voltage signals VO1, VO2, . . . , VOK may correspond to a respective one of the three or more voltage levels of the multi-level signal, and thus the number (e.g., K) of the plurality of voltage signals VO1, VO2, . . . , VOK may be substantially equal to the number of the three or more voltage levels of the multi-level signal (e.g., the number of voltage levels that the multi-level signal can have). For example, the driver circuit 2100 may include two or more transistors, the transistors included in the driver circuit 2100 may be transistors of different types, and the plurality of voltage signals VO1, VO2, . . . , VOK may be generated based on or using a body effect of the transistors included in the driver circuit 2100.

The output selection circuit 2200 selects one of the plurality of voltage signals VO1, VO2, . . . , VOK based on input data DAT including two or more bits, and outputs the selected voltage signal as an output data signal DS that is the multi-level signal. The output pad 2300 is connected to the output selection circuit 2200, and outputs the output data signal DS. The output pad 2300 is not connected to a termination resistor, and thus a current level of a DC current flowing through the driver circuit 2100 is lower than a reference current level.

Figure 18:
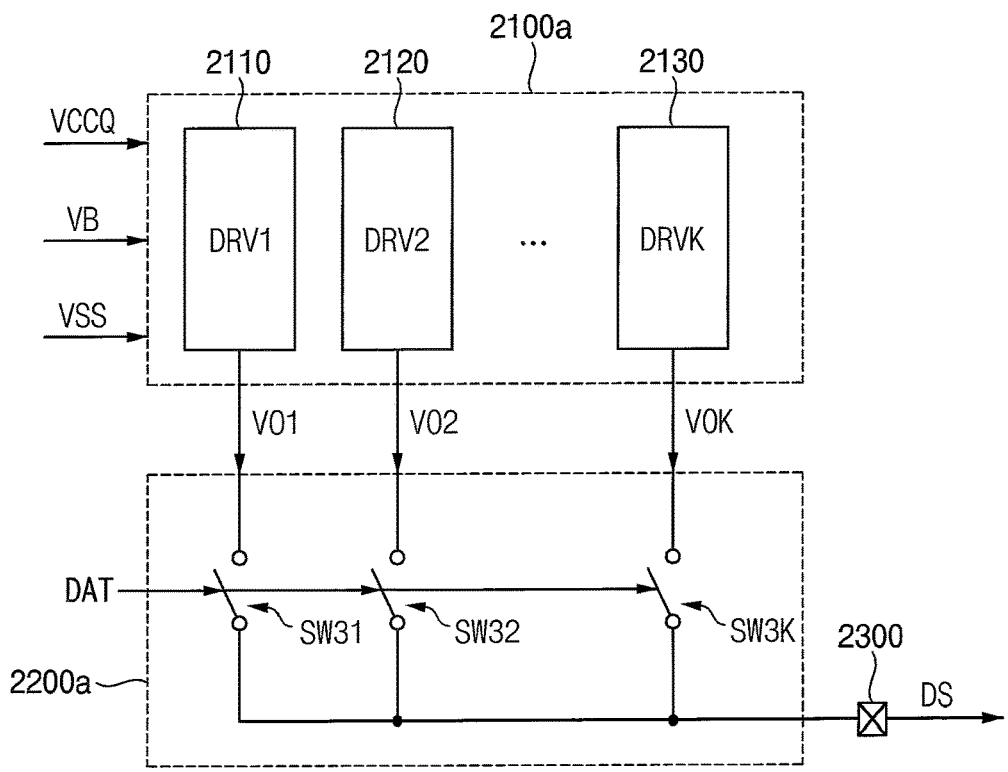
FIG. 18 is a block diagram illustrating an example of a transmitter of FIG. 17.

FIG. 18 is a block diagram illustrating an example of a transmitter of FIG. 17. Referring to FIG. 18, a transmitter 2000a includes a driver circuit 2100a, an output selection circuit 2200a and an output pad 2300. The driver circuit 2100a may include a plurality of drivers (DRV1, DRV2, DRVK) 2110, 2120 and 2130. Each of the plurality of drivers 2110, 2120 and 2130 may be connected between the power supply voltage VCCQ and the ground voltage VSS, and may include at least one transistor. Transistors included in different drivers may be transistors of different types. For example, at least one transistor included in the driver 2110, at least one transistor included in the driver 2120 and at least one transistor included in the driver 2130 may have the same conductivity type (e.g., an n-type or a p-type), and may have different threshold voltages. The plurality of drivers 2110, 2120 and 2130 may generate the plurality of voltage signals VO1, VO2, . . . , VOK having different voltage levels based on the body bias voltage VB.

The output selection circuit 2200a may include a plurality of switches SW31, SW32, SW3K that are turned on and off based on the input data DAT. For example, only one switch may be enabled or activated based on a combination of the two or more bits included in the input data DAT, and only one of the plurality of voltage signals VO1, VO2, . . . , VOK may be output as the output data signal DS through the output pad 1300.

Figure 19:
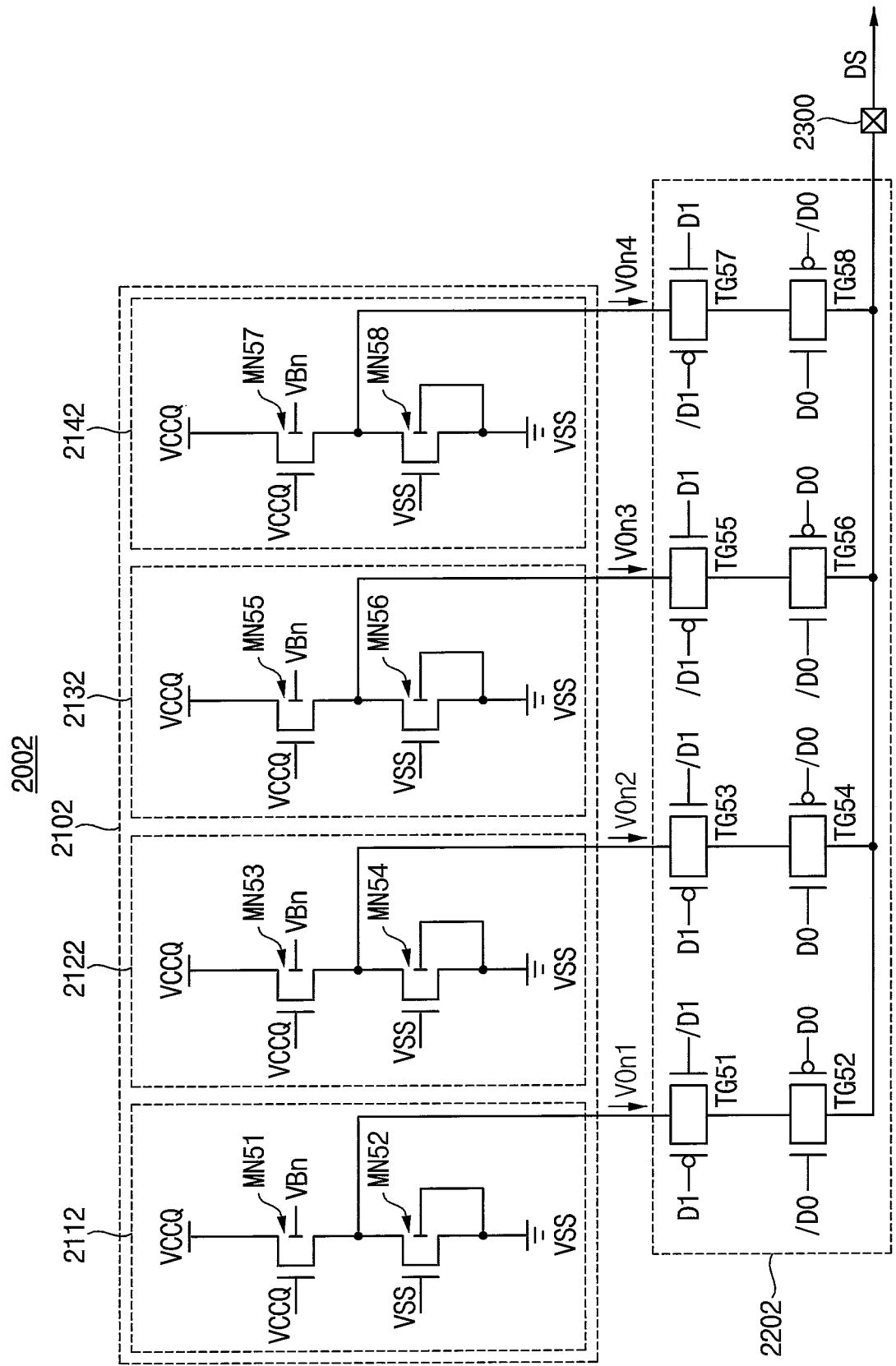
FIG. 19 is a circuit diagram illustrating an example of a transmitter of FIG. 18.

FIG. 19 is a circuit diagram illustrating an example of a transmitter of FIG. 18. FIG. 20 is a diagram for describing an operation of a transmitter of FIG. 19. Referring to FIGS. 19 and 20, a transmitter 2002 includes a driver circuit 2102, an output selection circuit 2202 (e.g., MUX) and an output pad 2300. The driver circuit 2102 may include a first driver 2112, a second driver 2122, a third driver 2132 and a fourth driver 2142.

The first driver 2112 may include a first PMOS transistor MN51 and a second PMOS transistor MN52. The first and second NMOS transistors MN51 and MN52 may be similar to the first and second NMOS transistors MN11 and MN12 in FIG. 8 and the first and second NMOS transistors MN41 and MN42 in FIG. 14. However, unlike the first NMOS transistors MN11 and MN41 in FIGS. 8 and 14, both the power supply voltage VCCQ and the body bias voltage VBn applied to the first NMOS transistor MN51 may have a fixed voltage level. The first NMOS transistor MN51 may have a first threshold voltage VTHn1. The first and second NMOS transistors MN51 and MN52 may be transistors of the same type (e.g., may have the same threshold voltage).

Similarly, the second driver 2122 may include a third NMOS transistor MN53 and a fourth NMOS transistor MN54 that are transistors of the same type; the third driver 2132 may include a fifth NMOS transistor MN55 and a sixth NMOS transistor MN56 that are transistors of the same type; and the fourth driver 2142 may include a seventh NMOS transistor MN57 and an eighth NMOS transistor MN58 that are transistors of the same type. Each of the second, third and fourth drivers 2122, 2132 and 2142 may have a configuration substantially the same as that of the first driver 2112, except that the third NMOS transistor MN53 has a second threshold voltage VTHn2, the fifth NMOS transistor MN55 has a third threshold voltage VTHn3 and the seventh NMOS transistor MN57 has a fourth threshold voltage VTHn4.

In some example embodiments, a first voltage signal VOn1 generated from the first driver 2112 may have a voltage level VCCQ-VTHn1 corresponding to a difference voltage obtained by subtracting the first threshold voltage VTHn1 from the power supply voltage VCCQ. Similarly, a second voltage signal VOn2 generated from the second driver 2122 may have a voltage level VCCQ-VTHn2, a third voltage signal VOn3 generated from the third driver 2132 may have a voltage level VCCQ-VTHn3, and a fourth voltage signal VOn4 generated from the fourth driver 2142 may have a voltage level VCCQ-VTHn4.

In some example embodiments, the first threshold voltage VTHn1 may have the highest voltage level, the second threshold voltage VTHn2 may have a voltage level lower than that of the first threshold voltage VTHn1, the third threshold voltage VTHn3 may have a voltage level lower than that of the second threshold voltage VTHn2, and the fourth threshold voltage VTHn4 may have the lowest voltage level.

The output selection circuit 2202, which operates as a 4-to-1 multiplexer (MUX) with two control signals DO, D1, may include transmission gates TG51, TG52, TG53, TG54, TG55, TG56, TG57 and TG58. The transmission gates TG51 through TG58 may output one of the first, second, third and fourth voltage signals VOn1, VOn2, VOn3 and VOn4 as the output data signal DS based on the first and second bits D1 and DO of the input data DAT, as illustrated in FIG. 20.

In an example of FIGS. 19 and 20, the voltage levels VCCQ-VTHn1, VCCQ-VTHn2, VCCQ-VTHn3 and VCCQ-VTHn4 of the output data signal DS may correspond to the voltage levels VL1, VL2, VL3 and VL4 in FIG. 6, respectively, and all of the voltage levels VCCQ-VTHn1, VCCQ-VTHn2, VCCQ-VTHn3 and VCCQ-VTHn4 may be between the voltage level of the ground voltage VSS and the voltage level of the power supply voltage VCCQ. For example, the voltage level VCCQ-VTHn1 that is the lowest voltage level may be higher than the voltage level of the ground voltage VSS, and the voltage level VCCQ-VTHn4 that is the highest voltage level may be lower than the voltage level of the power supply voltage VCCQ.

Figure 21:
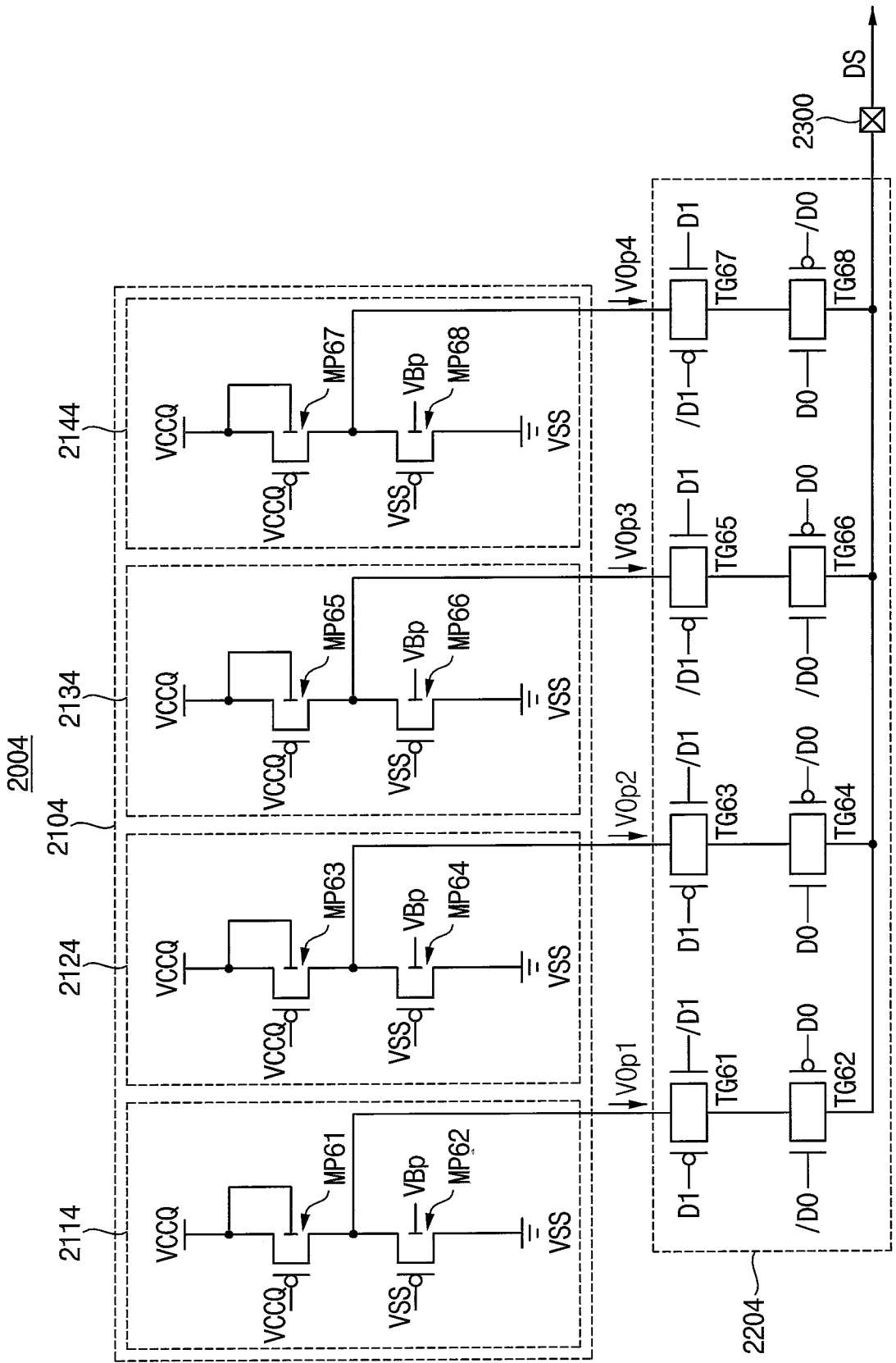
FIG. 21 is a circuit diagram illustrating an example of a transmitter of FIG. 18.

FIG. 21 is a circuit diagram illustrating an example of a transmitter of FIG. 18. FIG. 22 is a diagram for describing an operation of a transmitter of FIG. 21. The descriptions repeated with FIGS. 19 and 20 will be omitted. Referring to FIGS. 21 and 22, a transmitter 2004 includes a driver circuit 2104, an output selection circuit 2204 and an output pad 2300.

The transmitter 2004 may be substantially the same as the transmitter 2002 of FIG. 19, except that the driver circuit 2104 is implemented with PMOS transistors and a voltage configuration is therefore changed to accommodate the same overall function. The driver circuit 2104 may include a first driver 2114, a second driver 2124, a third driver 2134 and a fourth driver 2144. The first driver 2114 may include a first PMOS transistor MP61 and a second PMOS transistor MP62 that have a first threshold voltage VTHp1. The first and second PMOS transistors MP61 and MP62 may be similar to the first and second PMOS transistors MP21 and MP22 in FIG. 10, except that the body bias voltage VBp applied to the second PMOS transistor MP62 may have a fixed voltage level.

Similarly, the second driver 2124 may include a third PMOS transistor MP63 and a fourth PMOS transistor MP64 that have a second threshold voltage VTHp2, the third driver 2134 may include a fifth PMOS transistor MP65 and a sixth PMOS transistor MP66 that have a third threshold voltage VTHp3, and the fourth driver 2144 may include a seventh PMOS transistor MP67 and an eighth PMOS transistor MP68 that have a fourth threshold voltage VTHp4.

In some example embodiments, a first voltage signal V0p1 generated from the first driver 2114 may have a voltage level VTHp1 corresponding to the first threshold voltage VTHp1. Similarly, a second voltage signal VOp2 generated from the second driver 2124 may have a voltage level VTHp2, a third voltage signal VOp3 generated from the third driver 2134 may have a voltage level VTHp3, and a fourth voltage signal VOp4 generated from the fourth driver 2144 may have a voltage level VTHp4.

In some example embodiments, the first threshold voltage VTHp1 may have the lowest voltage level, the second threshold voltage VTHp2 may have a voltage level higher than that of the first threshold voltage VTHp1, the third threshold voltage VTHp3 may have a voltage level higher than that of the second threshold voltage VTHp2, and the fourth threshold voltage VTHp4 may have the highest voltage level.

The output selection circuit 2204 may include transmission gates TG61, TG62, TG63, TG64, TG65, TG66, TG67 and TG68. The transmission gates TG61 through TG68 may output one of the first, second, third and fourth voltage signals V0p1, VOp2, VOp3 and VOp4 as the output data signal DS based on the first and second bits D1 and DO of the input data DAT, as illustrated in FIG. 22.

In an example of FIGS. 21 and 22, the voltage levels VTHp1, VTHp2, VTHp3 and VTHp4 of the output data signal DS may correspond to the voltage levels VL1, VL2, VL3 and VL4 in FIG. 6, respectively, and all of the voltage levels VTHp1, VTHp2, VTHp3 and VTHp4 may be between the voltage level of the ground voltage VSS and the voltage level of the power supply voltage VCCQ. For example, the voltage level VTHp1 that is the lowest voltage level may be higher than the voltage level of the ground voltage VSS, and the voltage level VTHp4 that is the highest voltage level may be lower than the voltage level of the power supply voltage VCCQ.

Figure 23:
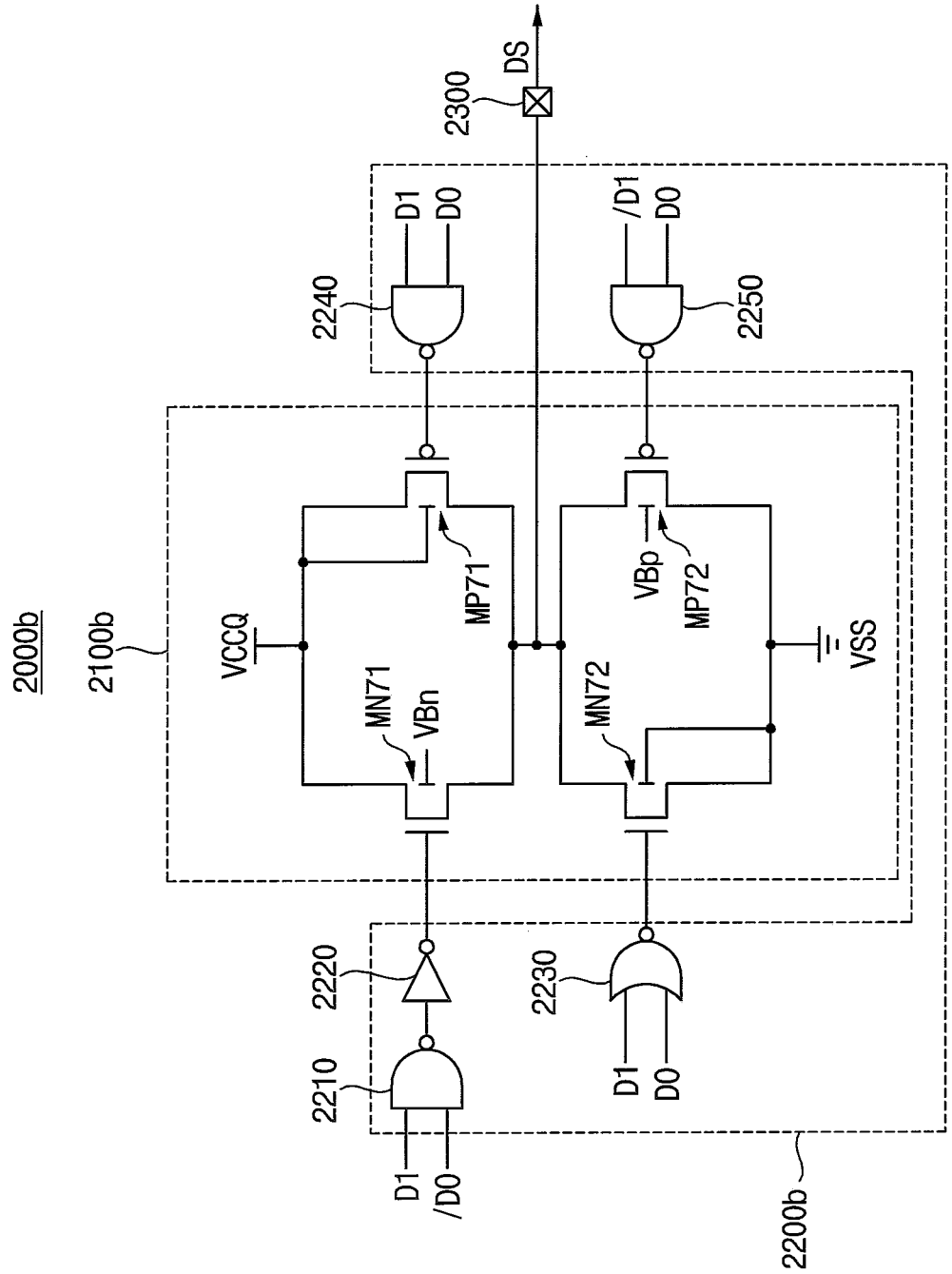
FIG. 23 is a block diagram illustrating an example of a transmitter of FIG. 17.

FIG. 23 is a block diagram illustrating an example of a transmitter of FIG. 17. FIG. 24 is a diagram for describing an operation of a transmitter of FIG. 23. Referring to FIGS. 23 and 24, a transmitter 2000b includes a driver circuit 2100b, an output selection circuit 2200b and an output pad 2300. The driver circuit 2100b may include a first NMOS transistor MN71, a second NMOS transistor MN72, a first PMOS transistor MP71 and a second PMOS transistor MP72.

The first NMOS transistor MN71 may be connected between the power supply voltage VCCQ and the output pad 2300, and may receive a first body bias voltage VBn. The second NMOS transistor MN72 may be connected between the output pad 2300 and the ground voltage VSS, and the ground voltage VSS may be connected to a body of the second NMOS transistor MN72. The first PMOS transistor MP71 may be connected between the power supply voltage VCCQ and the output pad 2300, and the power supply voltage VCCQ may be connected to a body of the first PMOS transistor MP71. The second PMOS transistor MP72 may be connected between the output pad 2300 and the ground voltage VSS, and may receive a second body bias voltage VBp.

The output selection circuit 2200b may include NAND gates 2210, 2240 and 2250, an inverter 2220 and a NOR gate 2230. The NAND gate 2210 may perform a NAND operation on the first bit D1 and the inverted second bit/DO. The inverter 2220 may invert an output of the NAND gate 2210, and an output of the inverter 2220 may be provided to a gate electrode of the first NMOS transistor MN71. The NOR gate 2230 may perform a NOR operation on the first bit D1 and the second bit DO, and an output of the NOR gate 2230 may be provided to a gate electrode of the second NMOS transistor MN72. The NAND gate 2240 may perform a NAND operation on the first bit D1 and the inverted second bit/DO, and an output of the NAND gate 2240 may be provided to a gate electrode of the first PMOS transistor MP71. The NAND gate 2250 may perform a NAND operation on the inverted first bit/D1 and the second bit D0, and an output of the NAND gate 2250 may be provided to a gate electrode of the second PMOS transistor MP72.

In some example embodiments, as illustrated in FIG. 24, when both the first and second bits D1 and D0 have a first value (e.g., "0"), the NOR gate 2230 may turn on the second NMOS transistor MN72, and the output data signal DS having the voltage level of the ground voltage VSS may be generated based on the second NMOS transistor MN72. When the first bit D1 has the first value and the second bit D0 has a second value (e.g., "1"), the NAND gate 2250 may turn on the second PMOS transistor MP72, and the output data signal DS having a voltage level corresponding to a threshold voltage VTHp of the second PMOS transistor MP72 may be generated based on the second PMOS transistor MP72. When the first bit D1 has the second value and the second bit D0 has the first value, the NAND gate 2210 and the inverter 2220 may turn on the first NMOS transistor MN71, and the output data signal DS having a voltage level corresponding to a difference voltage VCCQ-VTHn obtained by subtracting a threshold voltage VTHn of the first NMOS transistor MN71 from the power supply voltage VCCQ may be generated based on the first NMOS transistor MN71. When both the first and second bits D1 and D0 have the second value, the NAND gate 2240 may turn on the first PMOS transistor MP71, and the output data signal DS having the voltage level of the power supply voltage VCCQ may be generated based on the first PMOS transistor MP71. For example, the NOR gate 2230 may form a first output selection circuit, the NAND gate 2250 may form a second output selection circuit, the NAND gate 2210 and the inverter 2220 may form a third output selection circuit, and the NAND gate 2240 may form a fourth output selection circuit.

In an example of FIGS. 23 and 24, the voltage levels VSS, VTHp, VCCQ-VTHn and VCCQ of the output data signal DS may correspond to the voltage levels VL1, VL2, VL3 and VL4 in FIG. 6, respectively. The lowest voltage level among the voltage levels VSS, VTHp, VCCQ-VTHn and VCCQ may be the voltage level of the ground voltage VSS, and the highest voltage level among the voltage levels VSS, VTHp, VCCQ-VTHn and VCCQ may be the voltage level of the power supply voltage VCCQ.

Figure 25:
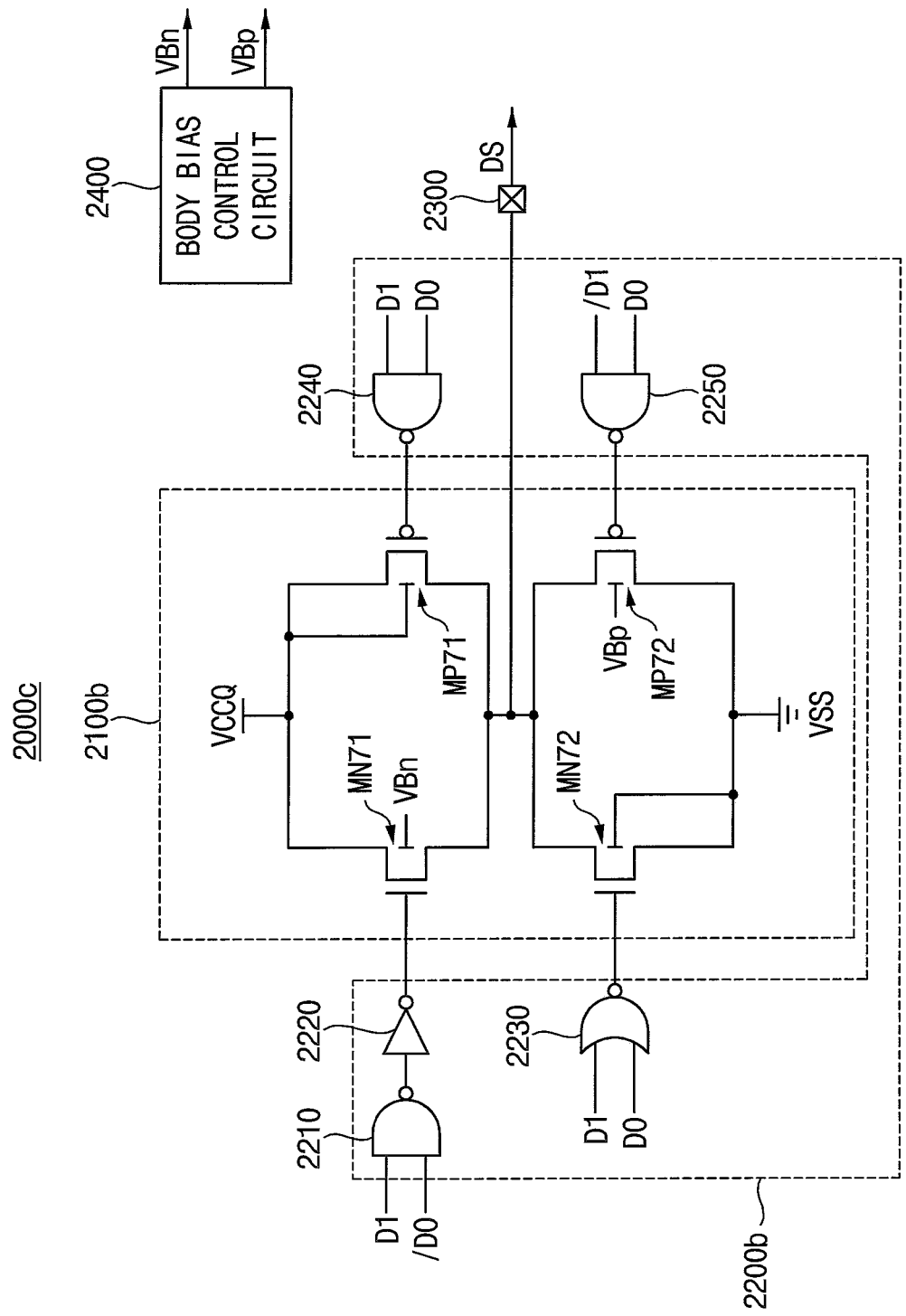
FIG. 25 is a block diagram illustrating an example of a transmitter of FIG. 17.

FIG. 25 is a block diagram illustrating an example of a transmitter of FIG. 17. The descriptions repeated with respect to FIG. 23 will be omitted. Referring to FIG. 25, a transmitter 2000c includes a driver circuit 2100b, an output selection circuit 2200b and an output pad 2300. The transmitter 2000c may further include a body bias control circuit 2400. The transmitter 2000c may be substantially the same as the transmitter 2000b of FIG. 23, except that the transmitter 2000c further includes the body bias control circuit 2400. The body bias control circuit 2400 may control voltage levels of the first and second body bias voltages VBn and VBp. Thus, when the voltage levels of the first and second body bias voltages VBn and VBp are controlled or adjusted, the voltage levels (e.g., the voltage levels VTHp and VCCQ-VTHn in FIG. 24) of the output data signal DS may also be adjusted.

Figure 26:
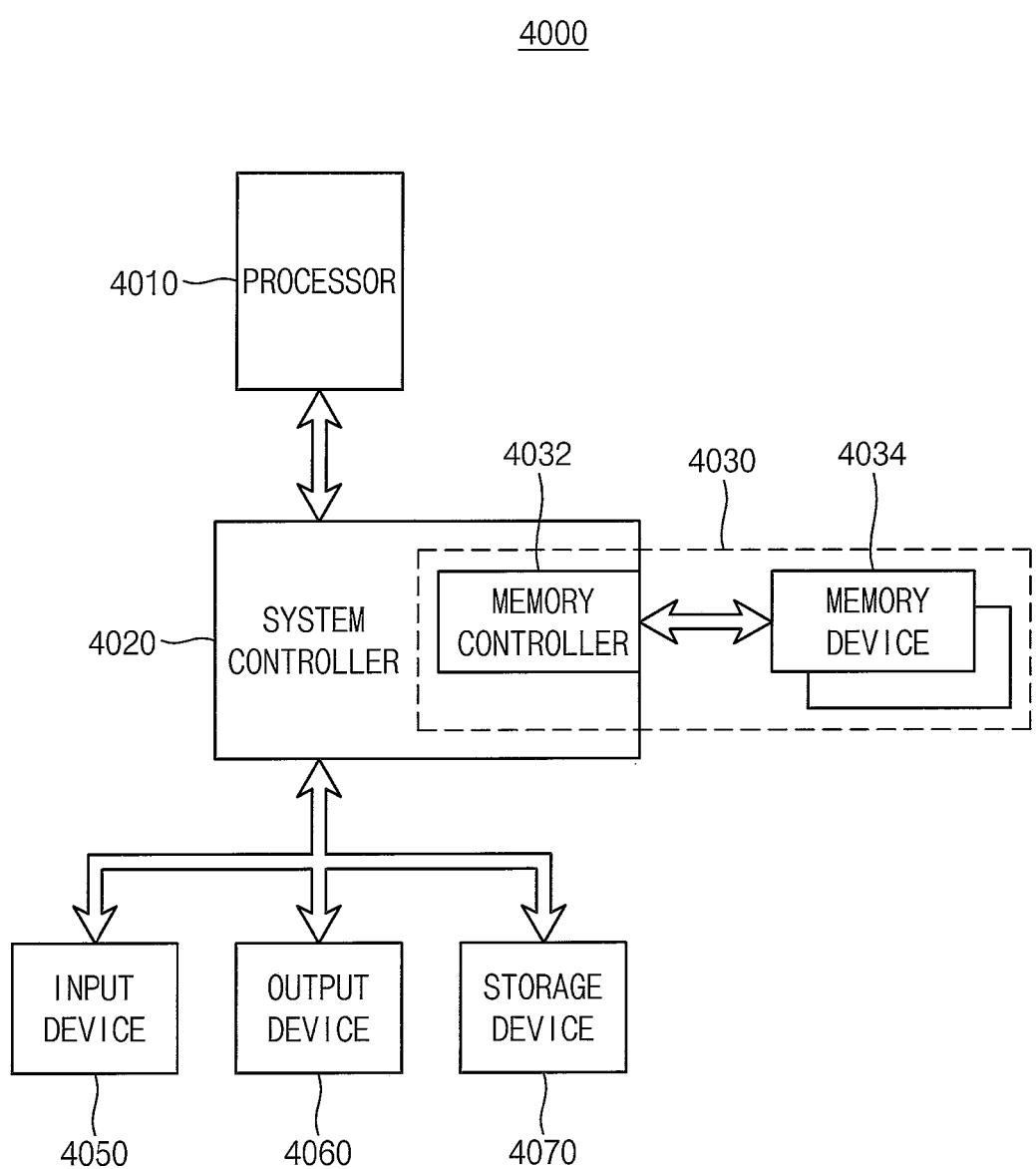
FIG. 26 is a block diagram illustrating a computing system according to example embodiments.

FIG. 26 is a block diagram illustrating a computing system according to example embodiments. Referring to FIG. 26, a computing system 4000 includes a processor 4010, a system controller 4020 and a memory system 4030. The computing system 4000 may further include an input device 4050, an output device 4060 and a storage device 4070. The memory system 4030 includes a plurality of memory devices 4034, and a memory controller 4032 for controlling the memory devices 4034. The memory controller 4032 may be included in the system controller 4020. The memory system 4030 may be the memory system according to example embodiments, and may include the transmitter according to example embodiments.

The processor 4010 may perform various computing functions, such as executing specific software instructions for performing specific calculations or tasks. The processor 4010 may be connected to the system controller 4020 via a processor bus. The system controller 4020 may be connected to the input device 4050, the output device 4060 and the storage device 4070 via an expansion bus. As such, the processor 4010 may control the input device 4050, the output device 4060 and the storage device 4070 using the system controller 4020.

Figure 27:
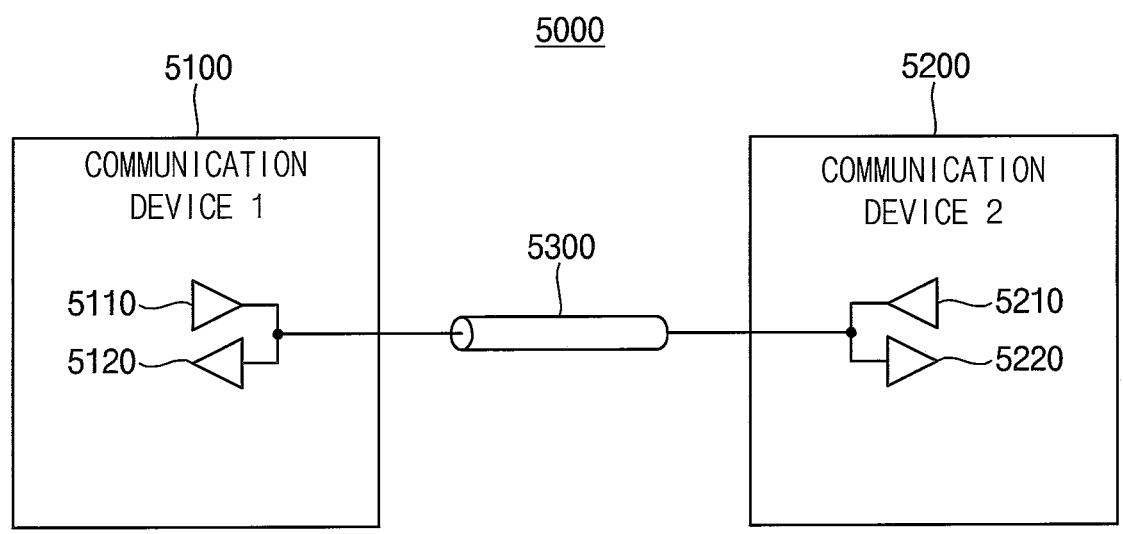
FIG. 27 is a block diagram illustrating a communication system according to example embodiments.

FIG. 27 is a block diagram illustrating a communication system according to example embodiments. Referring to FIG. 27, a communication system 5000 includes a first communication device 5100, a second communication device 5200 and a channel 5300. The first communication device 5100 includes a first transmitter 5110 and a first receiver 5120. The second communication device 5200 includes a second transmitter 5210 and a second receiver 5220. The first transmitter 5110 and the first receiver 5120 are connected to the second transmitter 5210 and the second receiver 5220 through the channel 5300. The transmitters 5110 and 5210 may be the transmitter according to example embodiments. In some example embodiments, each of the first and second communication devices 5100 and 5200 may include a plurality of transmitters and a plurality of receivers, and the communication system 5000 may include a plurality of channels for connecting the plurality of transmitters and a plurality of receivers.

The inventive concept may be applied to various devices and systems that include the memory devices and the memory systems. For example, the inventive concept may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:
1. A multi-level signal transmitter, comprising:
   a first voltage selection circuit configured to select one amongst a first plurality of driving voltages having different voltage levels, in response to input data including at least two bits of data therein; and a driver circuit configured to generate an output data signal in response to the selected one of the first plurality of driving voltages, which is provided as a body bias voltage to at least one transistor within the driver circuit, said driver circuit comprising:
- a first totem pole arrangement of a NMOS pull-up transistor and a PMOS pull-down transistor; and
- a second totem pole arrangement of a PMOS pull-up transistor and an NMOS pull-down transistor.

2. The transmitter of claim 1, further comprising:
a second voltage selection circuit configured to select one amongst a second plurality of driving voltages having different voltage levels, in response to the input data; and
an output selection circuit responsive to: (i) the selected one of the first plurality of driving voltages, and (ii) the selected one of the second plurality of driving voltages.

3. The transmitter of claim 1, wherein the output data signal is generated at an output node of the driver circuit, which is electrically connected to current carrying terminals of the NMOS pull-up and pull-down transistors and current carrying terminals of the PMOS pull-up and pull-down transistors.

4. The transmitter of claim 2, wherein the output selection circuit is responsive to a setting signal TMRS_IN and an enable signal EN; and wherein the output selection circuit generates either the selected one of the first plurality of driving voltages or the selected one of the second plurality of driving voltages, based on the setting signal TMRS_IN and the enable signal EN.

5. The transmitter of claim 4, wherein the driver circuit further comprises a multi-gate selector, which is responsive to the setting signal TMRS_IN and the enable signal EN.

6. The transmitter of claim 5, wherein the multi-gate selector has a first output electrically connected to a gate terminal of the NMOS pull-up transistor, and a second output electrically connected to a gate terminal of the PMOS pull-down transistor.

7. The transmitter of claim 1, wherein the first plurality of driving voltages equals $2^N$ driving voltages, where N is a number of bits of data within the input data.

8. A multi-level signal transmitter, comprising:
a first voltage selection circuit configured to select one amongst a first plurality of driving voltages having different voltage levels, in response to input data including at least two bits of data therein;
a second voltage selection circuit configured to select one amongst a second plurality of driving voltages having different voltage levels, in response to the input data;
an output selection circuit responsive to: (i) the selected one of the first plurality of driving voltages, and (ii) the selected one of the second plurality of driving voltages; and
a driver circuit configured to generate an output data signal in response to the selected one of the first plurality of driving voltages, which is provided as a body bias voltage to at least one transistor within the driver circuit, said driver circuit comprising:
- a first totem pole arrangement of a NMOS pull-up transistor and a PMOS pull-down transistor; and
- a second totem pole arrangement of a PMOS pull-up transistor and an NMOS pull-down transistor; and wherein the first plurality of driving voltages equals $2^N$ driving voltages, where N is a number of bits of data within the input data.

* * * * *